(12) United States Patent
Papanikolaou et al.

(10) Patent No.: US 11,848,653 B2
(45) Date of Patent: Dec. 19, 2023

(54) METHOD AND APPARATUS TO SPEED CONVERGENCE AND CONTROL BEHAVIOR OF DIGITAL CONTROL LOOP

(71) Applicant: MACOM Technology Solutions Holdings, Inc., Lowell, MA (US)

(72) Inventors: Vasilis Papanikolaou, Toronto (CA); George L. Barrier, IV, Lowell, MA (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 438 days.

(21) Appl. No.: 17/158,974

(22) Filed: Jan. 26, 2021

(65) Prior Publication Data

US 2021/0152143 A1 May 20, 2021

Related U.S. Application Data

(63) Continuation-in-part of application No. 16/417,513, filed on May 20, 2019, now Pat. No. 10,938,365.

(60) Provisional application No. 62/673,715, filed on May 18, 2018.

(51) Int. Cl.
*H03G 3/30* (2006.01)
*H03G 3/00* (2006.01)
*H03K 21/40* (2006.01)
*H03G 3/20* (2006.01)

(52) U.S. Cl.
CPC ............ *H03G 3/001* (2013.01); *H03G 3/20* (2013.01); *H03K 21/40* (2013.01)

(58) Field of Classification Search
CPC ....................................................... H03G 3/30
USPC ................................................ 330/278, 279
See application file for complete search history.

(56) References Cited

U.S. PATENT DOCUMENTS

| | | |
|---|---|---|
| 5,019,769 A | 5/1991 | Levinson |
| 5,383,208 A | 1/1995 | Queniat et al. |
| 5,396,059 A | 3/1995 | Yeates |
| 5,594,748 A | 1/1997 | Jabr |
| 5,812,572 A | 9/1998 | King et al. |
| 5,825,239 A * | 10/1998 | Adal ............... G11B 20/10203 327/332 |
| 5,838,194 A * | 11/1998 | Khoury .................... H03G 3/30 330/279 |
| 6,160,449 A * | 12/2000 | Klomsdorf ............ H03F 1/0205 330/149 |
| 6,494,370 B1 | 12/2002 | Sanchez |

(Continued)

*Primary Examiner* — Henry Choe
(74) *Attorney, Agent, or Firm* — Weide & Miller, Ltd.

(57) ABSTRACT

A system to control convergence of a loop to a reference value. A device, under control of the control loop, generates an output signal. A comparator compares the output signal to a reference value. Responsive to the output signal being less than the reference value, outputting an up signal and, responsive to the output signal being greater than the reference value, outputting a down signal. A counter is configured to maintain a counter value which is incremented in response to an up signal and decremented in response to a down signal. The counter outputs a gain control value. An up/down signal tracker is configured to track a pattern of up signals and down signals and compare the tracked pattern to one or more predetermined patterns such that, responsive to the up signals and down signals matching one of the one or more predetermined patterns, the counter size is decreased.

20 Claims, 17 Drawing Sheets

(56) References Cited

U.S. PATENT DOCUMENTS

| | | |
|---|---|---|
| 6,556,601 B2 | 4/2003 | Nagata |
| 6,707,492 B1 | 3/2004 | Itani |
| 6,934,479 B2 | 8/2005 | Sakamoto et al. |
| 6,952,531 B2 | 10/2005 | Aronson et al. |
| 7,227,916 B2 | 6/2007 | Ruelke et al. |
| 7,236,108 B2 | 6/2007 | Cheng |
| 7,265,334 B2 | 9/2007 | Draper et al. |
| 7,276,682 B2 | 10/2007 | Draper et al. |
| 7,381,935 B2 | 6/2008 | Sada et al. |
| 7,456,690 B2 * | 11/2008 | Kocaman ............. H03G 3/3052 330/129 |
| 7,505,498 B2 | 3/2009 | Sanchez |
| 7,701,833 B2 | 4/2010 | Kim |
| 7,734,309 B2 | 6/2010 | Chi et al. |
| 7,949,025 B2 | 5/2011 | Olea |
| 8,427,232 B2 * | 4/2013 | Qiu ........................ H03G 3/20 330/133 |
| 9,853,735 B1 | 12/2017 | Lin |
| 2003/0165168 A1 | 9/2003 | Murata |
| 2004/0070453 A1 * | 4/2004 | Dupuis ............. H03K 17/6872 330/279 |
| 2004/0188717 A1 | 9/2004 | Ono |
| 2005/0195037 A1 * | 9/2005 | Dupuis ............. H03K 17/6872 330/279 |
| 2006/0098699 A1 | 5/2006 | Sanchez |
| 2006/0126683 A1 | 6/2006 | Kang |
| 2006/0153256 A1 | 7/2006 | Sanchez |
| 2006/0165139 A1 | 7/2006 | Sanchez |
| 2009/0121790 A1 * | 5/2009 | Brown .................. H03M 3/456 327/60 |
| 2017/0288369 A1 | 10/2017 | Ikram et al. |

\* cited by examiner

METHOD AND APPARATUS TO SPEED CONVERGENCE AND CONTROL BEHAVIOR OF DIGITAL CONTROL LOOP

FIELD OF THE INVENTION

The invention relates to control loop convergence, and in particular to a system and method for increasing the rate to control loop convergence using dynamic step size or variable counter sizes.

RELATED ART

As part of communication between remote locations, it is required to process the received signal after the signal passes through the channel, to convert the received signal to data or other useful form. As is understood, regardless of whether the signal is an optic signal or electrical signal, passage through the channel can degrade the signal and cause it to lose power. However, a signal at a specified and known power level is required for downstream processing by other components in the communication system. This presents several challenges when receiving and processing the received signal.

One such challenge is that the power level of the received signal may be highly variable. For example, if the channel is poor or of long length, or if the signal is transmitted at a low power level, then the received signal magnitude will be small. Alternatively, the channel may be short, of high quality, or the signal may be transmitted at a high-power level, in which case the magnitude of the received signal will be high. Of course, any range of received signal magnitudes between high and low may also be received and this may change over time depending on any number of different factors including but not limited to changes in the channel, supply voltage changes, changes in installation (connected to a different channel) or a number of other factors. Regardless of the power of the received signal, it is desired to present a signal of a preferred power level (magnitude) to downstream processing element.

SUMMARY

To overcome the drawbacks of the prior art and provide additional benefits, a method for controlling convergence of an automatic gain control system is disclosed. This example method adjusts a magnitude of an input signal with a variable gain amplifier (VGA) to generate a VGA output signal. In this embodiment, the magnitude adjustment occurs based on control vector which is provided to the VGA. This method also includes processing the VGA output signal with a detector to determine a magnitude value of the VGA output signal and comparing the magnitude value to a target value.

Responsive to the comparing, this method determines if the magnitude value is less than the target value. If so, then this method evaluates the magnitude value in relation to the target value to determine the difference between the magnitude value and the target value. Thereafter, this method decreases the control vector by a first amount, a second amount, or directly to a minimum control vector amount based on the evaluating the magnitude value in relation to the target value. Alternatively, responsive to the comparing determining the magnitude value is greater than the target value, evaluating the magnitude value in relation to the target value to determine the difference between the magnitude value and the target value. Thereafter, increasing the control vector by a first amount, a second amount, or directly to a maximum control vector amount based on the evaluating the magnitude value in relation to the target value.

In one embodiment, the first amount is a step size of a single step, and the second amount is a step size greater than the single step. In one configuration, the magnitude value is a peak value of the VGA output signal. This method may further comprise converting the control vector to an analog control signal such that the analog control signal is the control signal to control gain of the VGA.

Also disclosed is a system for controlling gain of a variable gain amplifier comprising a detector module configured to determine a magnitude value of a variable gain amplifier output. Also, part of this embodiment is a comparator module configured to compare the magnitude value to a target value and responsive to the comparison, generate an up_dn signal. A digital control module is configured to receive the up_dn signal and processes the up_dn signal to generate a control vector. One or more digital to analog converters are configured to convert the control vector to an analog control signal such that the analog control signal controls the gain of the variable gain amplifier.

In one embodiment, the comparator module consists of three comparators. The detector module may be configured as a peak detector configured to detect a peak value of the variable gain amplifier output. In one configuration, the digital control module comprises control logic, a user interface, memory or registers, and one or more comparators. It is contemplated that the digital control module may be configured to evaluate the up_dn signal in relation to a threshold value and, responsive to the evaluation increase or decrease the control vector by a step max value or adjust the control vector up or down small step size. In another variation, the digital control module evaluates past values of the up_dn signal to adjust a step size value such that the step size signal controls the rate of change of the control vector, and based on the up_dn signal increasing or decreasing the control vector by the step size value.

Also disclosed is a method for controlling gain of a variable gain amplifier based on a control vector value comprising monitoring a variable gain amplifier output signal to create a monitor signal and comparing the monitor signal to a target value to create an up_dn value, the up_dn value indicating whether the monitor signal is greater than or less than the target value. Then, evaluating the up_dn values for changes in the up_dn value over a predetermined number of up_time values. Responsive to the changes in the up_dn value over a predetermined number of up_time values, reducing a step size value. Responsive to zero or less than a certain number of changes in the up_dn value over a predetermined number of up_dn values, increasing a step size value. Then, increasing the control vector value by the step size value if the monitor signal is greater than the target value or increasing the control vector value by the step size value if the monitor signal is greater than the target value? Thereafter, adjusting the gain of the variable gain amplifier based on the control vector value. In this embodiment, decreasing the control vector value increases the gain and increasing the control vector value decreases the gain. However, in other embodiment, other relationships may be established between the control vector value and the gain and thus the claims and disclosure is not limited to a particular set relationship.

In one embodiment, this method further comprises converting the control vector value to an analog control signal and providing the analog control signal to the variable gain amplifier. The step of monitoring the variable gain amplifier output signal may comprise determining a peak value of the variable gain amplifier output signal. In one configuration, the up_dn signal is either a logical "0" value indicating that the variable gain amplifier output signal is less than the target value or a logical "1" value indicating that the variable gain amplifier output signal is greater than the target value. The step size value has a maximum value which determines the maximum rate of change of the control vector value. In one example embodiment, the predetermined number of up_dn values is ten, reducing the step size value reduces the step size value by half, and increasing the step size value doubles the step size value.

Also disclosed is a method for controlling convergence of an automatic gain control unit comprising receiving an input signal and adjusting the peak to peak magnitude of the input signal with a variable gain amplifier (VGA) based on a control vector. In this method the VGA generates a VGA output signal. Then, processing the VGA output signal with a peak detector to determine a peak value of the VGA output signal and comparing the peak value to a target value. Responsive to the comparing, determining if the peak value is greater than or less than the target value and responsive to the comparing determining if the peak value is less than the target value then performing the following. Comparing the peak value to the target value to determine if the peak value is less than the target value by a threshold value, responsive to the peak value not being greater than the target value by a threshold value, determining if the control vector is at the minimum value. Responsive to the control vector being at the minimum value then not changing the control vector. Alternatively, responsive to the control vector not being at the minimum value, decreasing the control vector by first amount.

The threshold values are controlled by the analog circuit and not under digital control. In one embodiment, the threshold values programmable, but in other embodiments the values are fixed. The thresholds should be programmed to assert up_max and dn_max when the output signal amplitude is significantly wrong. The "up_max" should be asserted when the control vector should be significantly increased. The "dn_max" should be asserted when the control vector should be significantly reduced.

This method also includes, responsive to the comparing determining if the peak value is greater than the target value by the threshold value, determining if the control vector is within a step max value of a minimum control vector value. Responsive to the control vector being within a step max value of a minimum control vector value, decreasing the control vector to the minimum control vector value. Otherwise, responsive to the control vector being greater than the step max value from the minimum control vector value, decreasing the control vector by the step max value.

In this method, responsive to the comparing determining if the peak value is greater than the target value, comparing the peak value to the target value to determine if the peak value is less than the target value by a second threshold value. And, responsive to the peak value not being greater than the target value by a second threshold value, determining if the control vector is at the maximum value. Responsive to the control vector being at the minimum value, not changing the control vector, and responsive to the control vector not less than the maximum value, increasing the control vector by first amount.

This method also includes, responsive to the comparing determining if the peak value is greater than the target value by the second threshold value, determining if the control vector is within a step max value of a maximum control vector value. Then, responsive to the control vector being within a step max value of a maximum control vector value, increasing the control vector to the maximum control vector value, or responsive to the control vector being greater than the step max value from the maximum control vector value, increasing the control vector by the step max value.

In one embodiment the second amount is greater than two steps. In one configuration, the control vector controls the gain of the VGA. The step max value is a maximum amount that the control vector can be changed at a time.

To overcome the drawbacks of the prior art, a system for controlling gain of a variable amplifier is disclosed. In one embodiment, the system includes an error detector configured to compare an amplifier output to a reference value and responsive thereto, output an error signal. Also part of this system, is a counter, having a counter size, configured to maintain a counter value reflecting the error detector output over time and responsive to the counter valuing reaching the counter size, outputting a gain control signal. An error detector signal monitor is configured to track the error detector signal over time, and responsive to the error detector signal meeting a predetermined pattern, providing a counter size control signal to the counter to reduce the counter size which reduces a time required for the amplifier output to reach the reference value.

In one embodiment the reference value comprises the intended or desired amplifier output magnitude (peak, average, or other designation). This system may further comprise a loop state machine and a digital to analog converter such that the loop state machine is configured to convert the gain control signal to a digital gain control value, which is provided to the digital to analog converter, which converts the digital gain control value to an analog gain control signal that is provided to the variable amplifier. In one configuration, Wherein the error detector signal monitor, responsive to the error detector signal not meeting the predetermined pattern, is configured to increase the counter size.

The step of increasing the counter size may comprise resetting the counter size to a maximum counter size.

Also disclosed is a method for controlling gain of a variable gain amplifier. In one embodiment, this method comprises comparing a variable gain amplifier output signal to a reference value to determine if the variable gain amplifier output signal is greater than or less than the reference value. Then, responsive to the variable gain amplifier output signal being greater than the reference value, generating an up signal. Responsive to the variable gain amplifier output signal being less than the reference value, generating a down signal and updating a counter responsive to an up signal and responsive to a down signal. This method of operation tracks a number of up signals and down signals in relation to a predetermined pattern. Responsive to the counter reaching a maximum counter value or a minimum counter value, outputting a counter output signal to adjust the gain of the variable gain amplifier. responsive to the number of up signals and down signals in relation to the predetermined pattern meeting the predetermined pattern, changing the size of the counter.

In one embodiment, the reference value comprises the intended or desired amplifier output magnitude (peak, average, or other designation). This method may also include updating a counter responsive to and up signal and a down signal comprises. The step of tracking may comprise maintaining a running total or prior pattern of up signals and/or down signals in comparison to a predetermined or predefined pattern of up signals and down signals. The counter size is the counter value that must be reached before the counter generates an output and resets.

The pattern may be a predetermined consecutive number of up signals or a predetermined consecutive number of down signals. In another embodiment, the pattern is a predetermined number of up signals or a predetermined consecutive number of down signals in relation to a predetermined number of up signals and down signals. This method may further comprise, responsive to the counter value reaching the counter size value or predetermined counter minimum value, resetting the counter to a counter midpoint value.

Also disclosed is a system to control convergence of a control loop to a reference value comprising a device, under control of the control loop, configured to generate an output signal, and a comparator configured to: compare the output signal to a reference value, responsive to the output signal being less than the reference value, output an up signal, and responsive to the output signal being greater than the reference value, outputting a down signal. Also part of this system is a counter having a counter size that defines a counter max value and a counter min value. The counter is configured to maintain a counter value which is incremented in response to an up signal and decremented in response to a down signal, such that the counter outputs a gain control value. An up/down signal tracker is provided and configured to track a pattern of up signals and down signals and compare the pattern to one or more predetermined patterns, and responsive to the up signals and down signals matching one of the one or more predetermined patterns, changing the counter size.

In one embodiment, the up/down signal tracker comprises memory and one or more comparators. It is contemplated that changing the counter size may comprise sending a control signal to the counter to reduce the size of the counter. The device under control of the control loop may be a variable gain amplifier The system may further comprise a loop state machine configured to, responsive to the gain control value from the counter, increase or decrease a digital value that represents the gain control signal. The system may further comprise, responsive to the up signals and down signals not matching one of the one or more predetermined patterns, increasing the counter size.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 8 is a collective index figure showing the relationship of FIG. 8A and FIG. 8B.

DETAILED DESCRIPTION

Figure 1:
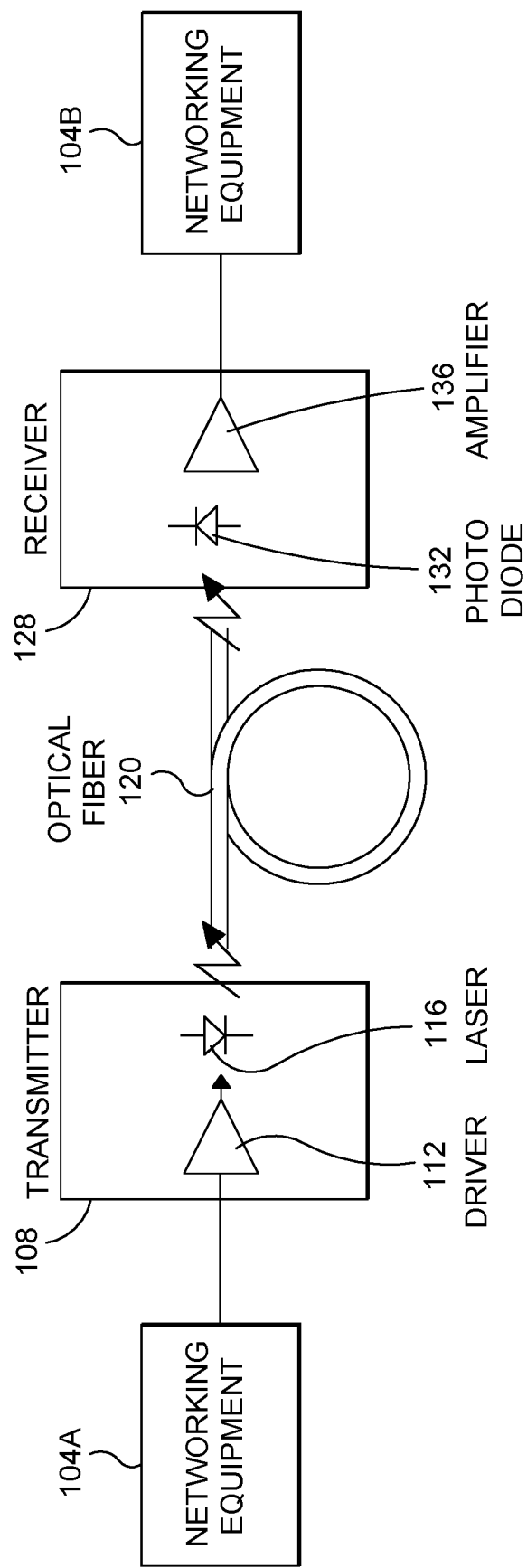
FIG. 1 illustrates an exemplary optic fiber communication link.

One example environment of use is in an optic communication system that utilizes optical fiber links and lasers or some other form of optic signal generator (light source). Although shown in an optic communication system, it is also contemplated that the system may be electrical and utilized as an electrically conductive channel. FIG. 1 illustrates an exemplary optic fiber communication link. To enable communication between remote networking equipment 104A, 104B a fiber optic transmitter and receiver is provided. Laser drivers 112, part of a transmitter 108, drive the lasers 116 with a modulating current which produces modulating optical output from lasers. This optical output is coupled into the optical fiber 120 for signal transmission. At the receive side of the optical fiber link is a receiver 128. Optical energy is converted into electrical signals by a photodiode 132 and processed further by an amplifier 136 to set the signal magnitude to a level suitable for downstream processing elements. It is contemplated that the innovation disclosed herein may be used in other environments or that this environment of use may vary from that shown.

Figure 2A:
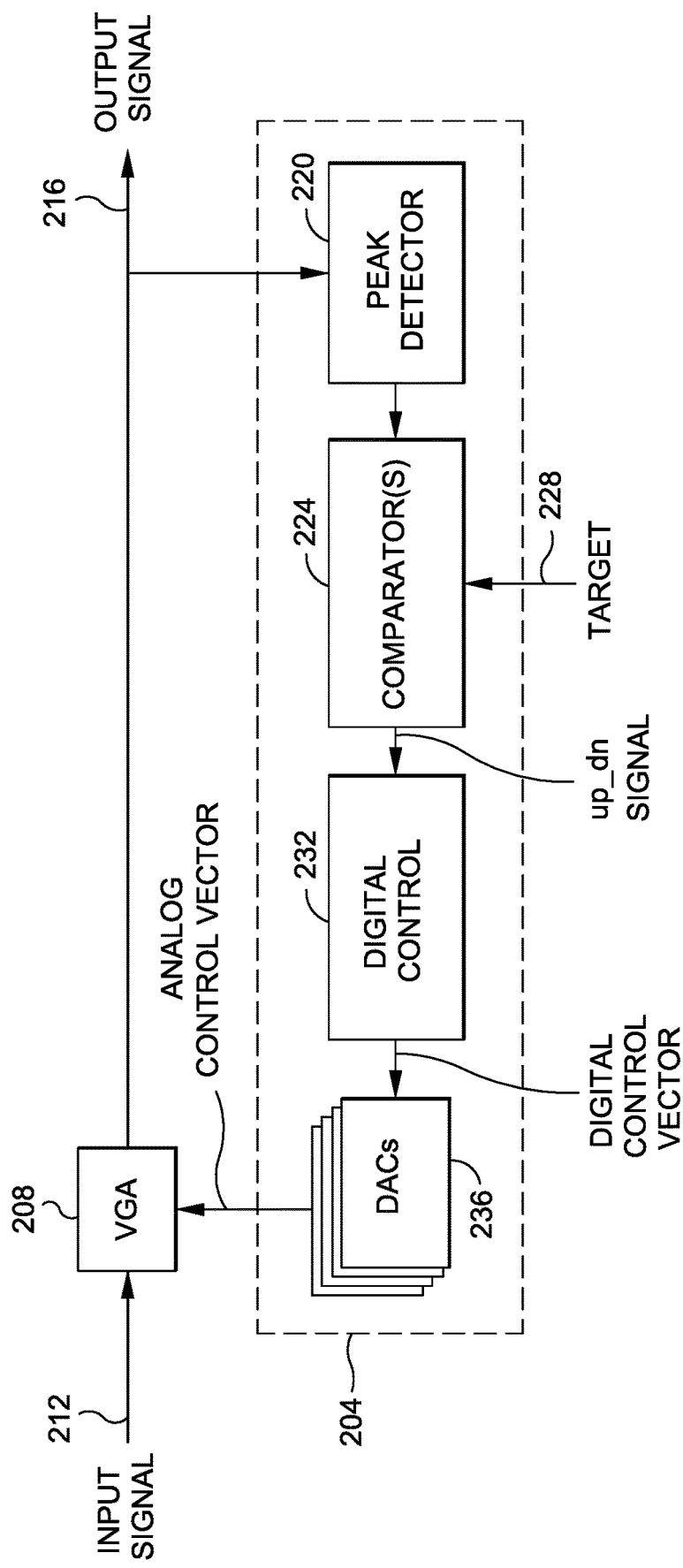
FIG. 2A illustrates a block diagram of an exemplary variable gain amplifier control system.

FIG. 2A illustrates a block diagram of an exemplary variable gain amplifier control system. This is but one possible configuration and it is contemplated that other embodiments are possible without departing from the scope of the invention. In this embodiment, the control system 204 provides analog control signals to the VGA (variable gain amplifier) 208 to control the gain of the VGA. An input signal is provided from an input terminal 212 to the VGA 208. The input signal may be provided from any device or system, such as but not limited to a photodetector. The input signal is amplified (or de-amplified) and presented as an output signal on an output terminal 216. The amount of amplified (or de-amplified), also referred to as gain, is determined by the control signal.

The VGA control system 204 is configured with a peak detector 220 that receives the output signal from the output terminal 216 as shown. Although shown and described herein as a peak detector, any aspect of the signal may be detected, such as but not limited to magnitude, average, peak values may be detected. The peak detected may be any type monitor or detector. The peak detector 220 analyzes the output signal and generates a value which represents the peak op amplitude (signal magnitude) of the output signal. In other embodiments, devices other than a peak detector may be used. Peak detectors 220 are generally known in the art and hence not described in detail herein. In this embodiment the peak detector 220 may also convert the signal to a digital format and thus may include one or more analog to digital converter. In some embodiments the peak detector is not includes or part of the comparator 224.

The output of the peak detector 220 feeds into a comparator 224. Although shown as one comparator 224, the comparator could be one or more comparators. The comparator 224 compares the signal magnitude from the detector 220 to a target value 228. The target value 228 is a value that represents a desired signal magnitude that is best suited for downstream processing of the output signal. The target value may be programed and changed by a user using a user interface or fixed. The target value may be stored in a memory. In this example embodiment, the comparator 228 provides a logic level output of a '0' or a '1' logic value. In the discussion herein, the output of the comparator 228 provides a comparator output signal that indicates the results of the comparison. For purposes of discussion, this signal is referred to as an up_dn signal such that logic '0' value indicates that the output signal is less than the target value, and logic level '1' value indicates that the output signal is greater than the target value. When the output signal is less than the target magnitude, the function of the VGA control system 204 is to increase the gain of the VGA 208 which in turn increases the magnitude of the output toward the target value. Gain of the VGA is increased by decreasing a control vector (digital control value). Conversely, when the output signal is greater than the target magnitude, the function of the VGA control system 204 is to decrease the gain of the VGA 208 which in turn decreases the magnitude of the output toward the target value. Over time, the output signal magnitude will approach and be at the target value. The output of the comparator 224 is defined as the up_dn signal which indicates whether the gain should be increased or decreased.

The comparator output feeds into a digital control unit 232. The digital control unit 232 includes one or more logic elements, registers, memory, or other elements configured to process the up_dn signal from the comparator 224 to generate a control vector. The control vector is a digital value that represents gain such that increasing the control vector decreases gain and increasing the control vector decreases gain. In other embodiments or configurations, different relationships between the gain and control vector may be established. During each clock cycle or sample period the gain may be increased a small amount, a single step, or a large amount, such as many steps. It is contemplated that during a cycle, or recurring time periods, the output signal is sampled by the detector thus resulting in new up_dn signals being created over time.

The control vector from the digital control unit 232 is provided to one or more digital to analog converters (DACs) 236. The DACs 236 convert the control vector from a digital format to an analog format which is suitable for injection into the analog VGA 208 to control the gain. The digital control vector and DACs are configured with high resolution which is determined by the number of steps between the minimum and maximum control vector values. For example, there may be 1000 or more steps between minimum and maximum control vector values. The greater the resolution, i.e. number of digital steps between a maximum and minimum control vector values, the greater the ability to control the gain of the VGA and the output signal magnitude. It is generally preferred to have high degree of output signal magnitude control for accuracy, thus requiring a large number of steps in the digital control vector and DACs 236. However, if a large number of steps are available, then it will take a greater number of cycles to change from a high gain state to a lower gain state.

Figure 2B:
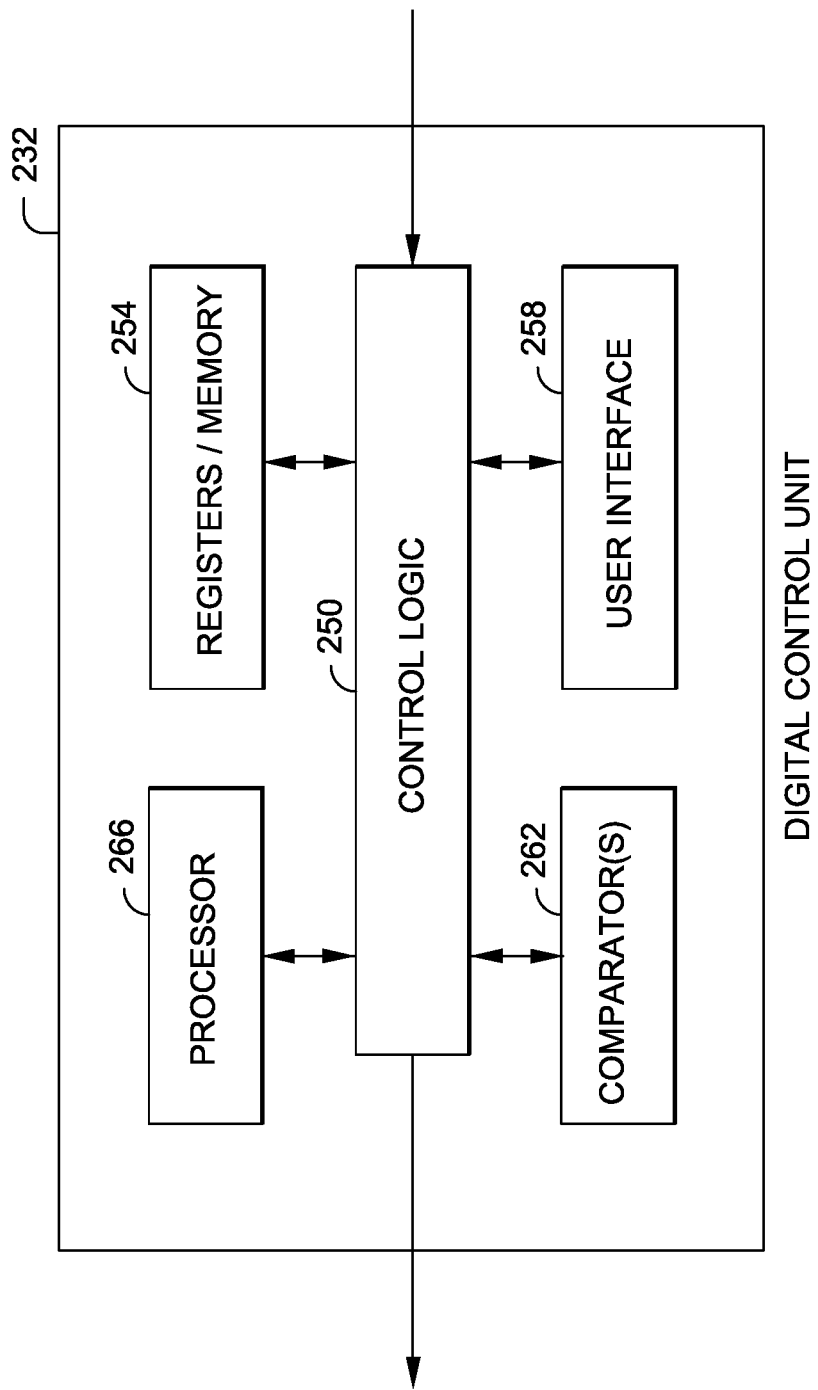
FIG. 2B illustrates a block diagram of an exemplary digital control unit.

FIG. 2B illustrates an example embodiment of the digital control unit shown in FIG. 2A. This is but one possible configuration of elements and other elements or arrangements may be used without departing from the innovation. The digital control unit 232 includes control logic configured to process the received signal as described herein and interact with one or more other elements of the digital control unit. In various embodiments, not every element shown in FIG. 2B will be included. Also, part of the digital control unit 232 are data storage registers and/or memory 254. The data storage registers and/or memory 254 can store the up_dn signal, max_step, step_size values, or any other data, or machine-readable code, such as software. A processor may also be part of the digital control unit 232 configured to execute machine readable code stored in a non-transitory state in the memory 254 to perform the functions described herein. The functions may be alternatively or in part, performed by the control logic 250.

A user interface 258 is provided in the digital control unit 232 to provide access for a user to set or change one or more of the values stored in the registers/memory 254 or update the software/machine readable code, or perform any other function to effect operation or adaptation of the system. It is contemplated that the functions described herein may be executed in hardware using control logic and registers, software executed in the processor 266, or a combination of both. One or more comparators 262 are also provided as discussed herein to compare the various values. In some embodiments, the comparators 262 may be replaced by the comparators 224 as shown in FIG. 2A or be software functions.

One challenge presented with systems that adjust the gain concerns the rate of change of the gain change over time. While it is possible to increase or decrease the gain by a large amount during a clock cycle, doing so is generally undesirable because large sudden changes in the gain disrupt the signal thereby disrupting downstream signal processing and decoding which in turn introduces errors thus peaking the bit error rate.

At the same time, changing the gain too slowly also presents several disadvantages. One such disadvantage presents itself during training. During training the system is adapting to an unknown channel and as such the gain may need to be increased by a large amount. If the rate of change of the gain is slow, such as due to having a high number of steps in the digital control vector between minimum and maximum values, then the VGA may take an excessive amount of time to present an output signal with a magnitude that matches the target value. If this occurs, the system will not complete training during the set training period and downstream system training will also be delayed or fail. The following discussion focuses on the comparator 224 and digital control unit 232 operation to enable various routines for control vector generation and adaptation that overcomes the drawbacks of the prior art.

Stated another way, the digital controller 232 drives a number of output signals to an array of small digital-to-analog (DAC) circuits 236. In other embodiments, a single output may be provided to a single DAC. In this example embodiment, the DACs 236 are 6-bit DAC circuits that work together to define the gain of the (VGA) 208. The digital control unit 232 decides how the multiple DACs 236 work together in the system based on the value of a wider 11-bit loop control vector. In this embodiment, the automatic gain control (AGC) loop has 2018 (0-2017) unique values for the loop control vector. In other embodiments the control vector may have a different number of unique values. The number is a function of the number of DACs 236 and the number of unique values for each DAC. The control loop is updated at a relatively slow speed, intentionally, to reduce the chance of disturbing the data path with its motion. As a result, in prior art systems a lot of time can be consumed ramping the control vector to its convergence point.

Figure 6:
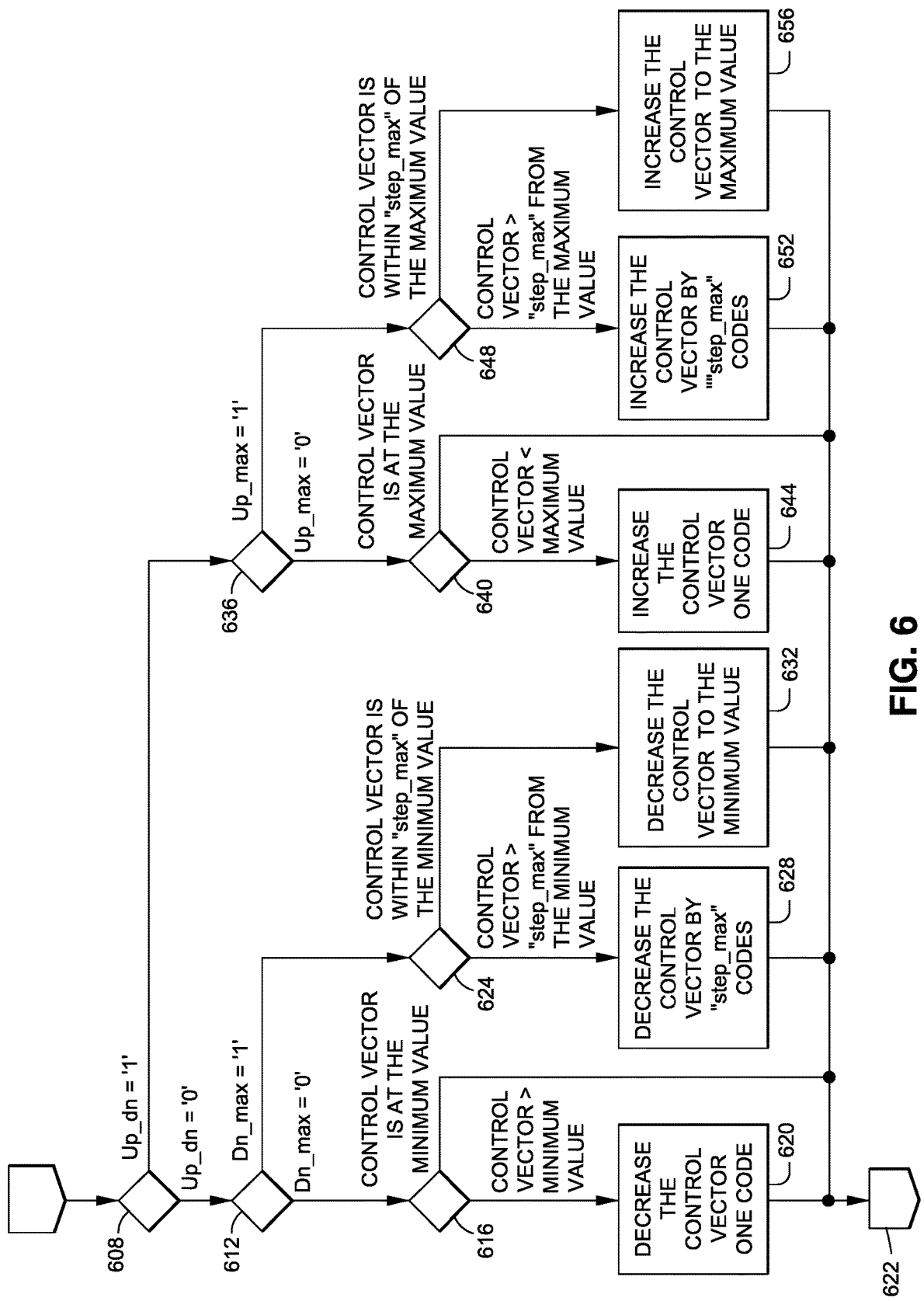
FIG. 6 illustrates an operational flow diagram of a VGA control method.

In the embodiment of FIG. 6, there are three input signals ("up_max", "dn_max", and "up_dn") which instruct the digital control loop how to adjust the control vector. These signals are produced by a comparator that compares the actual signal strength (such as peak) with a pre-defined target. A peak detector is (most likely) used to measure the signal strength of the output waveform. The purpose of the closed-loop system is to ensure the output signal strength is predictable no matter how strong or weak the input signal (within limits of course).

Figure 4:
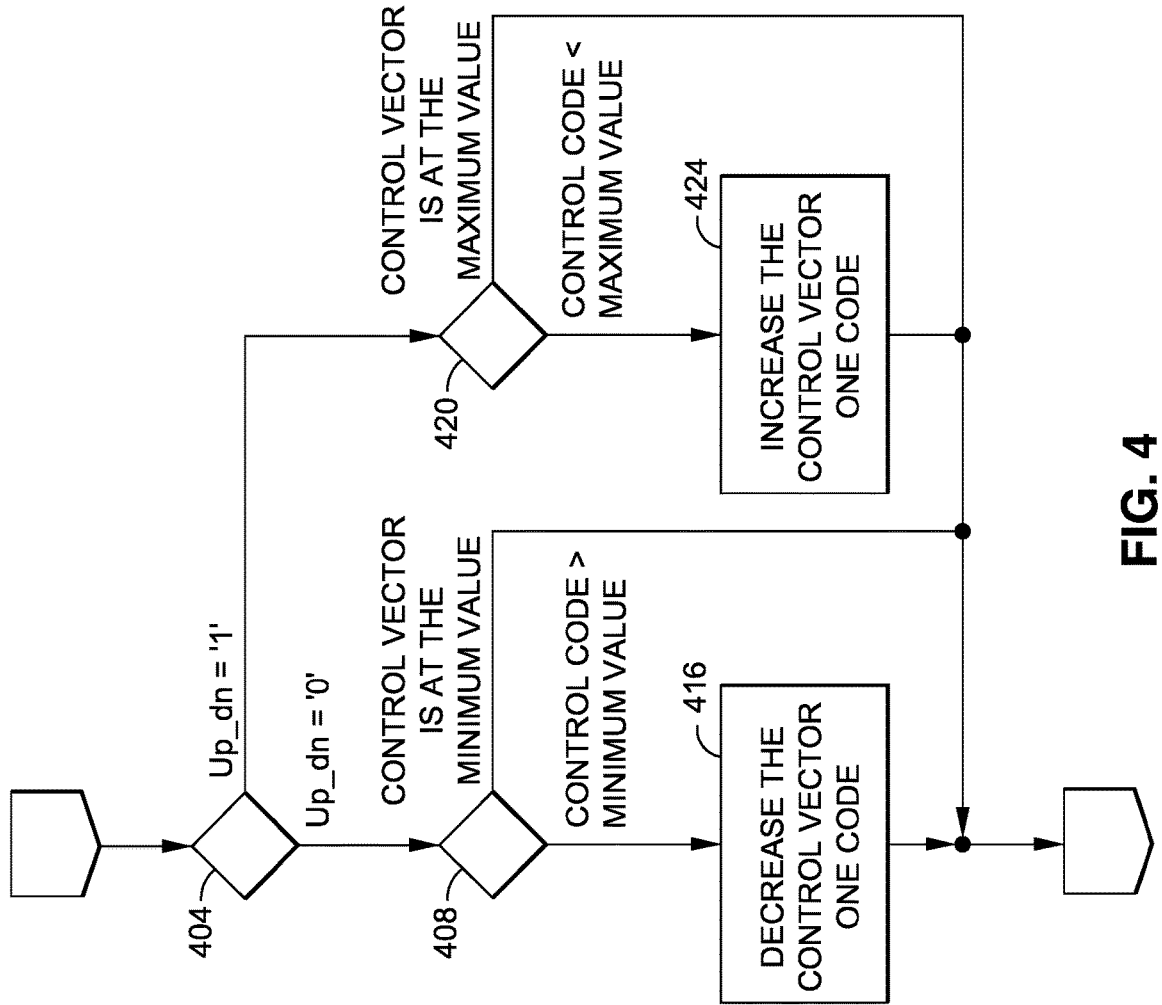
FIG. 4 is a more detailed version of a prior art process of adjusting the control vector.
Figure 3:
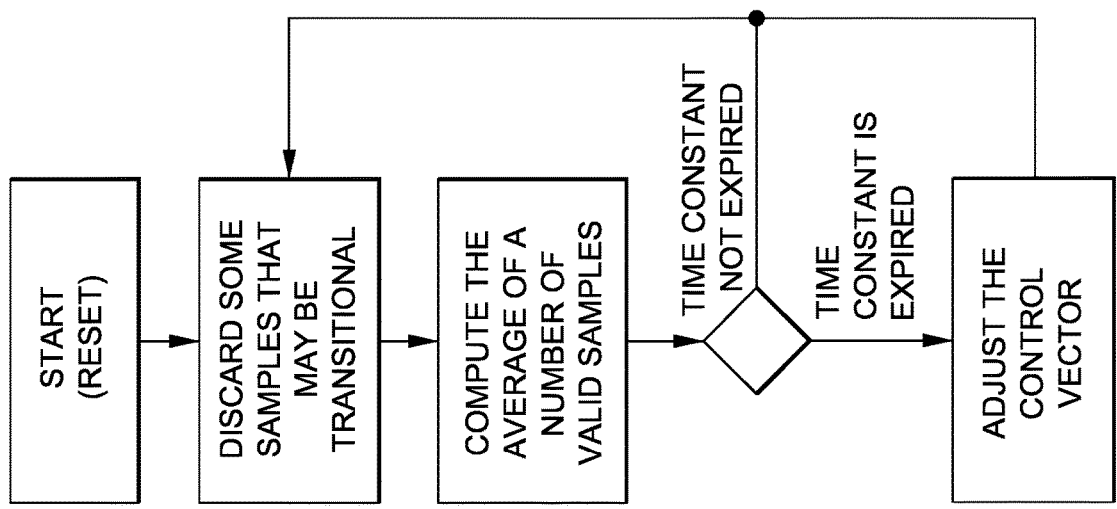
FIG. 3 illustrates prior art method for control vector adjustment.

Before discussing FIG. 6, FIGS. 3 and 4 are discussed. FIG. 3 illustrates a prior art method for control vector adjustment. The method of FIG. 3 starts at a step 304 and by collecting samples but then, at step 308, discards some samples which are transitional or outside of an average range. At a step 312 the system computes the average number of valid samples. Next, at a decision step 316, this method of operation evaluates whether a time constant or time period has expired. If not, then the operation returns to collect more samples and continue to calculate the average value. Once the time period expires, then the samples are compared to the target value and a control signal adjusts the control vector, at step 320, which in turn adjusts the gain of the VGA. It is also contemplated that the host controller may disable the automatic loop and instead set the gain manually. In this embodiment, the digital control unit does not change the gain automatically. It is assumed that any automatic adjustments originate from the host controller. While this method of operation is functional, it lacks the benefit of real time tracking and gain adjustment.

FIG. 4 is a more detailed version of a prior art process of adjusting the control vector. Starting at a step 404, the digital controller determines if the up_dn signal is a logic 0 or 1, i.e. if the output signal is less than or greater than the target value. If the up_dn signal is a 0 value then the control vector should be reduced and the operation advances to decision step 408. At decision step 408 the digital controller determines if the control vector is at the minimum value. If the control vector is at the minimum value then the operation advances to the end and no changes are made to the control vector. Alternatively, if at step 408 the control vector is not at the minimum value, then the control vector is reduced by one unit or increment. The term control vector and control code may be used interchangeably.

Alternatively, if at step 404 the up_dn signal is a logic 1 value indicating that the control vector should be increased, then the operation advances to decision step 420. At decision step 420, the control logic determines if the control vector is at the maximum control vector value. If so, the operation ends without making any changes to the control vector since it is already at its maximum value. Alternatively, if at step 420 the control vector is not at its maximum value, then the operation advances to step 424. At step 424 the digital controller increases the control vector by one step. In this example embodiment, the analog system is designed such that the maximum control vector code corresponds to the lowest gain and the minimum control vector code corresponds to the highest gain. In other embodiments, other relationships may be established without departing from the scope of the claims. When the up_dn signal is at logic level 0 it indicates that the signal strength is less than the target and thus the system should increase the gain (by lowering the control vector code).

In this example method of operation, the control vector is adjusted automatically based on the up_dn feedback signal from the analog portion of the loop. The control vector changes only one unit or increment at a time using single-steps, reducing the chance of disturbing the data path. If the data path is already disturbed by a sudden change in input signal, the slow control loop may take a long time to adjust to the new equilibrium thereby causing the training phase to time out before ideal gain convergence is achieved. Using single steps prolongs this disturbance.

Figure 5:
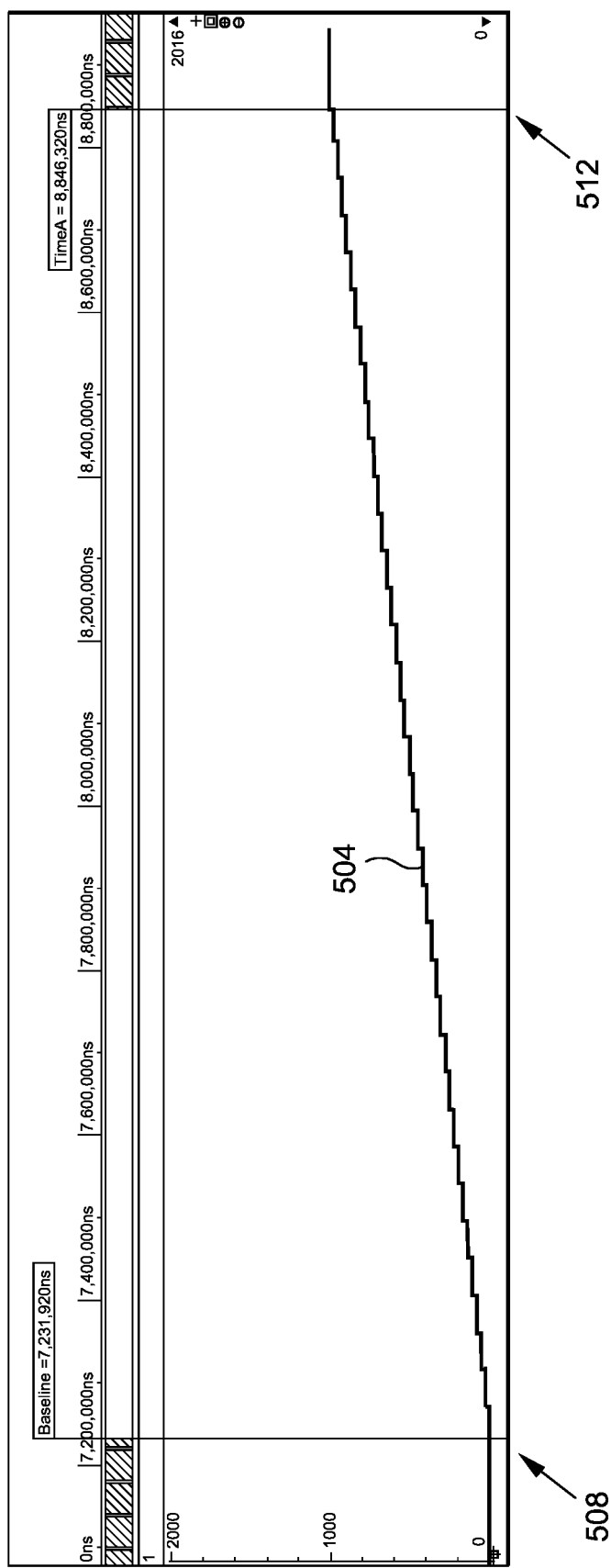
FIG. 5 illustrates an example plot of the control vector value versus time for the method of FIG. 4.

FIG. 5 illustrates an example plot of the control vector value versus time for the method of FIG. 4. The vertical axis represents the control vector value while the horizontal axis represents time. As can be seen in this plot 504, the control signal increases over time, starting at a first time 508 until a second time 512, to reach the desired gain level. Using single steps as shown, 1009 loop iterations are required to re-acquire equilibrium in this example. The settling time is so long because the control vector needed to traverse many steps to reach the new equilibrium point. This number of steps and this amount of time is too long to be completed during a training period.

While the prior art method discussed in FIG. 4 was suitable for prior art environments, it suffers from several drawbacks in VGA control system which have high resolution of gain control and/or which require other than slow acquisition of the output signal to the target value.

FIG. 6 illustrates an operational flow diagram of a VGA control method. This is but one possible method of operation and deviations from this exact method are contemplated which do not depart from the innovation disclosed herein. In general, this method of operation utilizes a control loop with three comparators. The comparators compare the output signal to a target value to determine if the output signal is greater than or less than the target value and the resulting comparison results in the up_dn signal. A second comparator compares the output signal to the target value to determine if the output signal is greater than the target value by a first threshold value. The second comparator outputs a Dn_max signal in response to the comparison. The Dn_max signal is a logic value output of 0 or 1. A logic value 0 indicates that the output signal is not greater than the target by the first threshold value. A third comparator compares the output signal to the target value to determine if the output signal is less than the target value by a second threshold value. The third comparator outputs an Up_max signal in response to the comparison. The Up_max signal is a logic value output of 0 or 1. A logic value 0 indicates that the output signal is not less than the target by the second threshold value. The first and second threshold values may be the same or different values but are assumed to be greater than one. The second comparator outputs a Dn_max signal in response to the comparison. Thus, during operation, three control signals are generated, namely, the up_dn signal, Dn_max signal, and the Up_max signal.

Using these values, the control vectors can be adjusted, in certain situations, by greater than one step at a time. In particular, if the comparison between the output signal magnitude and the target value reveals that the output signal magnitude differs from the target value by an amount greater than the first threshold or the second threshold, then that is an indication that the output signal is far from the target value by an amount greater than the threshold value. When this occurs, it is an indication that the control vector should be moved by more than one increment and, consequently, the control value is increased or decreased by a number of increments defined as the max_step value. The max_step value is a user settable value that is stored in a memory or a register. The max_step value is a value that defines how many units or increments the control value will be increased or decreased when the output signal is greater than or less then the target value from the threshold amount. FIG. 6 provides a more detailed description of this method of operation.

This method of operation starts at a step 604 where a comparison occurs between the output signal (the peak value of the VGA output), and the target value. Decision step 608 occurs such that the comparator output signal (the up_dn signal) from the comparator is detected and analyzed by the digital control unit. If the up_dn signal is a logic 0 value (meaning the peak value is less than the target value) then the operation advances to decision step 612. This may be generally defined as the path that decreases the control vector. At decision step 612 the comparators determine if the output signal is greater than the target value by a threshold value. If at decision step 612 output signal is not greater than the target value by a threshold value, then the Dn_max signal is set to logic level 0 and the operation advances to decision step 616.

At decision step 616 it is determined whether the control vector is already at its minimum value, and thus cannot be further reduced. If the control vector is at its minimum, the process advances to step 622 and ends, although the monitoring and comparing of the output signal to the target value continues over time to provide real time and dynamic gain control.

Alternatively, if at step 616 the control vector is greater than the minimum value the operation advances to step 620. At step 620, the control system adjusts (decreases) the control vector by one and the VGA gain is adjusted downward by one unit or increment.

Alternatively, if at step 612 the comparator determines that the output signal is greater than the target value by the threshold value, then the Dn_max signal is set to logic level 1 and the operation advances to decision step 624. At decision step 624, if the control vector is within the max_step number of increments of the minimum control vector value, then operation advances to step 632 and the control vector is decreased to the minimum value and the operation thereafter ends at step 622 but monitoring continues.

Alternatively, if at decision step 624 the digital control unit determines that the control vector value is greater than the step_max value from the minimum value, the control vector is decreased by the step_max value. This occurs at step 628. Hence, the control vector is decreased by more than one unit or increment since the step_max value is much larger than one, such as for example 10 or 20 steps, or any value greater than one. This allows the output signal to reach the target value faster than the prior art system which provides for only one unit of increment during a cycle of the control loop. The step max value is selected such that moving the gain by the max step amount does not disrupts system operation. In one embodiment, this is 1% to 7% of the total number of steps from minimum to maximum control vector values. In another embodiment it is less than 15% of the total. Thereafter, the process advances to the end step 622 and another loop cycle of monitoring and processing occurs.

Alternatively, if at step 608 the comparison of the output signal to the target value determines that the output signal magnitude (such as peak or peak to peak value) is greater than the target value, then the operation advances toward decision step 636. This path of the operation increases the control vector. At decision step 636 a determination is made regarding the difference between the output signal and the target signal in relation to the Up_max signal. As discussed above, the Up_max signal is a value that determines whether the difference between the output signal and the target signal is so great that the change in the control vector should be greater than one unit or step. If the difference between the output signal and the target signal (the differential) is less than the up_max value (threshold), then the logic output of the comparator performing this comparison is a logic 0 and the operation advances to decision step 640.

At decision step 640, a determination is made whether the control vector is at its maximum value or whether the control vector is less than the maximum value. If the control vector is at the maximum value, then the operation advances to end step 622 and no changes are made to the control vector. This occurs because no additional increase can be made to the control vector, it already being at its maximum value.

Alternatively, if at step 640 the control vector is less than the maximum control vector value, the operation advances to step 644 and the control vector is increased by one unit or step. After the increase, the operation advances to step 622 and the loop process repeats. Hence, because the control output signal value (magnitude peak to peak) is not greater than the target value by more than the Up_max value then the gain is close to being correct and thus the control vector should be increased by only one unit or step.

Returning to step 636, if the comparison between the difference between the output signal and the target signal (the differential) is greater than the Up_max value (threshold), then the logic output of the comparator performing this comparison is a logic 1 and the operation advances to decision step 648. At decision step 648 a determination is made in relation to the value of the step_max value and the control current vector value. If at decision step 648 the control vector is greater than the step_max value from the maximum value then the operation advances to step 652 at which point the control vector is increased by the max_step value because it has been determined that the output signal magnitude is far from the target value, thus a large increase in the control vector is needed to increase the rate of convergence. After step 652, the operation advances to step 622 and the loop repeats.

Alternatively, if at step 648 the operation determines that the control vector is within the step_max value of the maximum control vector value, then the operation advances to step 656 and the control vector is increased to the maximum value and this completes the loop iteration at step 622.

The control vector is adjusted automatically based on the "up_max", "dn_max", and "up_dn" feedback from the analog portion of the control loop. The two extra signals provide a way to tell the digital block when the control vector is "way off" the equilibrium. When "up_max" is asserted, the loop moves by a number of steps defined by the control register "step_max". When "dn_max" is asserted, the control vector is reduced by a "step_max" number of steps. Otherwise, the loop moves up or down by single steps according to the "up_dn" input signal. This requires that the analog block decide when the control vector is significantly off target. In one embodiment, this enhanced control option is enabled by the setting "step_mode" register to "01".

Figure 7:
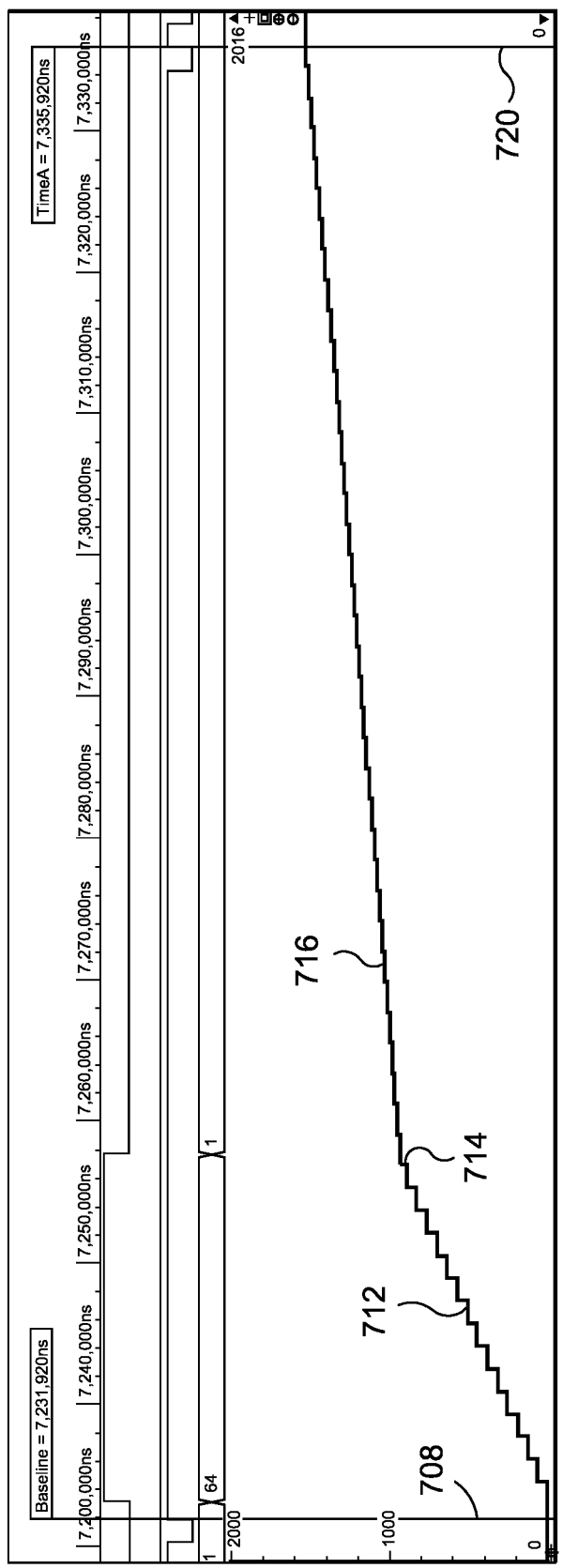
FIG. 7 illustrates a plot of the control vector value over time for the method of FIG. 6.

FIG. 7 illustrates a plot of the control vector value over time for the method of FIG. 6. Control vector value is represented on the vertical axis 730 while time is represented on the horizontal axis 734. At loop start time 708, the loop starts detecting and analyzing the output signal in relation to the target value. During the time period corresponding to the signal plot 712, the system determines that the output signal differs from the target value by a large amount, more than Up_max or Dn_max values so it ramps up the control vector quickly by adding the step_max to the control vector with each loop iteration. At a time 714, the detection system determines that the difference between the output signal and the target value is not so different as to warrant a max_step increase in the control vectors so during the time period for the signal plot section 716 the loop performs a single unit or increment increase in the control vector which results in the small steps in the gain. At time 720, the output signal has reached the target value and the loop has reached equilibrium.

Using multiple step size modes of FIG. 6, only 65 loop iterations are required to re-acquire equilibrium in this example. This is a 93.6% improvement over using single-steps from FIGS. 4 and 5.

Figure 8A:
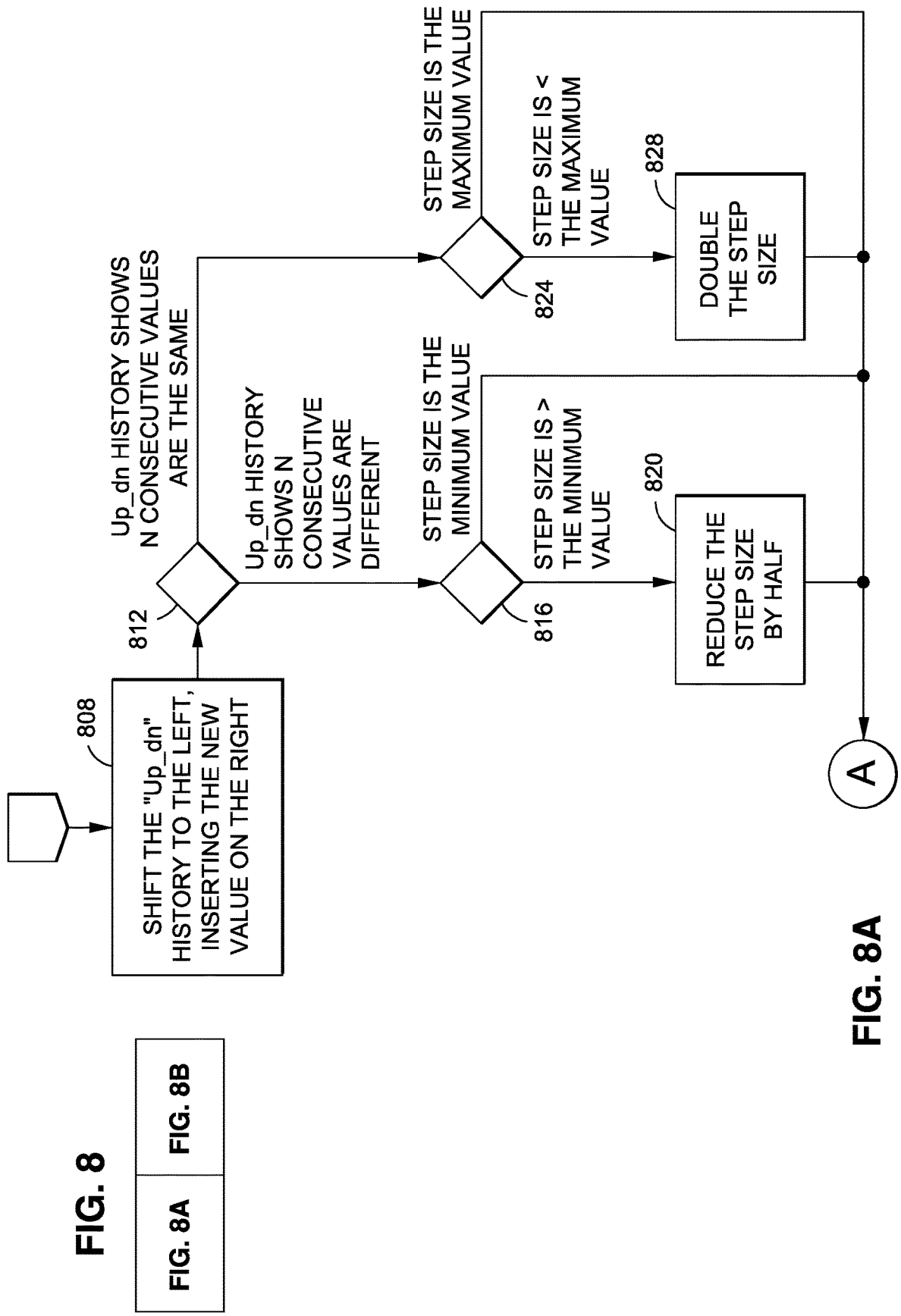
FIG. 8A illustrates a first portion an operational flow chart of an alternative method of control vector adjustment.
Figure 8B:
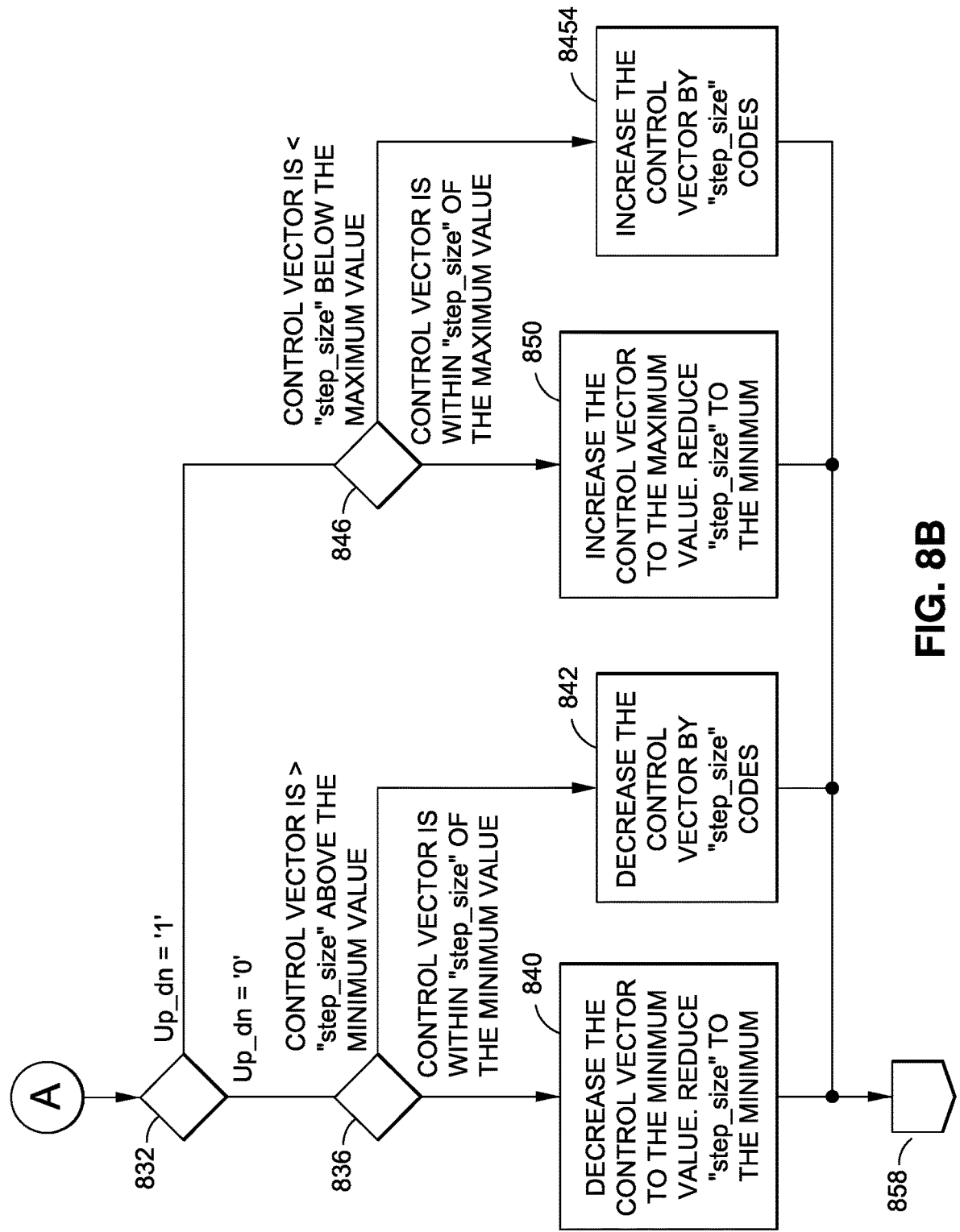
FIG. 8B illustrates a second portion the operational flow chart of the alternative method of control vector adjustment shown in FIG. 8A.

FIG. 8 is an index showing the relationship between FIG. 8A and FIG. 8B. FIG. 8A and FIG. 8B illustrate an operational flow chart of an alternative method of control vector adjustment. This is but one possible method of operation and it is contemplated that other methods of operation may be enabled without departing from the scope of the invention. In this embodiment, the control vector is adjusted automatically based on the "up_dn" feedback signal from the analog portion of the loop. The digital block monitors the history of "up_dn" over time to determine whether the control vector is significantly off target based on the historic value of the up_dn signal. In this embodiment, a shift register or other memory type stores the value of "up_dn" each time the control loop is updated. The oldest value is discarded from the end of the stack while the newest value is inserted at the start. This may be referred to as a first in, first out process. Like in the other embodiments, the up_dn value (signal) is a logic value 0 or 1.

As shown in FIG. 8A, this method of operation starts such that a comparison occurs between the output signal (the peak value of the VGA output), and the target value. The comparison generates the up_dn signal. This process may repeat several times such that the up_dn values are stored in memory/registers. If the value of "up_dn" is not the same N times in a row (where N is a value set by the user within a range of numbers), the control loop has recently crossed its convergence point and the step size is reduced by half. This occurs because changes over time in the up_dn value indicate that the output signal has recently been at or crossed over the target value. This reduction by half of the control vector happens each time the control loop is updated until the step size becomes "step_min" (default 1). The time delay from the digital control unit output back to the "up_dn" input is relatively small so 8 loop iterations are enough to detect multiple crossings. In other embodiments, a different number of iterations may be used. At convergence of the output signal with the target signal, the step size should always be the minimum size. When the up_dn signal does not change over a predetermined number (N) of sample indicates that the step size may be increased or decreased. Reducing the step size by half for every loop iteration causes the step size, and hence control vector to change more slowly over time. For example, if the step size is 128, then halving it results in the step size to be 64 and during the next iteration to be 32, and during the next iteration the step size drops to 16. Thus, in just three cycles the step size has dropped from 128 to 16. This results in a faster rate of change of the control vector but not so fast to disrupt operation. These numbers are exemplary only and the claims are not limited by these numeric values. The step size is the amount the control vector changes, which in turn controls the gain, which in turn controls the output signal magnitude.

The same principles apply with regard to increasing the step size, which doubles when N number of up_dn signals are the same, i.e. logic 1 value. If the N most recent values of the up_dn signal are the same, the step size is doubled. If the up_dn signal does not change, then the step size increases each time the control loop is updated until the maximum step size is reached or until the value of "up_dn" changes. The maximum step size prevents the step size from becoming too large, which could lead to too large of a change in the gain in one step. If the control vector reaches the upper limit while "up_dn" is '1', the step size is immediately reduced to the minimum step size "step_min". If the control vector reaches the lower limit while "up_dn" is '0', the step size is reduced immediately to "step_min". Dynamic step size may be selected by setting the "step_mode" register to "10" (default value).

Returning to FIG. 8A, the operation develops a new up_dn value at the digital control unit and in particular, a data storage register. This method of operation starts at a step 604 where a comparison occurs between the output signal (the peak value of the VGA output), and the target value. This comparison determines the up_dn value, which is stored in the memory/registers. At a step 808, the digital control unit shifts the newest up_dn value into the register which causes the other values to shift to the left such that the new value is inserted on the right. Next, at decision step 812 the digital control unit determines if the last N number of consecutive values for up_dn, stored in the register, are the same or if the N number of values are different. If the last N values of the up_dn value are not the same, then the operation advances to decision step 816. At decision step 816 a determination is made regarding the step size and whether the step size is at a minimum value or is greater than the minimum value. If at decision step 816 the step size is greater than the minimum step size value, then the operation advances to step 820. At step 820 the step size is reduced by half. In other embodiments the step size may be reduced (or increased) at a rate or amount that is other than half. After step 820, the operation advances to decision step 832, which is discussed in greater detail below on FIG. 8B.

Returning now to step 816, if the step size is at the minimum value, it follows that it cannot be reduced anymore, so the operation advances to decision step 832, discussed below. Returning to step 812, if the up_dn history is such that the history (register) shows N number of consecutive up_dn values which are the same, then the operation advances to decision step 824. At decision step 824 a determination is made by comparing the step size to the step size maximum value. If the step size is at the maximum value, then the operation advances to step 832 and no changes are made to the step size due to it already being at the maximum value. Alternatively, if the step size is less than the maximum value, then the operation advances to step 828 and the step size is doubled, or as stated above, or increased by some value, ratio, or factor. After step 828 the operation advances to step 832.

At decision step 832 (FIG. 8B), the digital control unit determines if the comparison between the output signal and the target value resulted in the up_dn signal being a logic level 0 or a logic level 1. If the up_dn is a 0, meaning the output signal is less than the target value, then the operation advances to step decision step 836 (for eventual reduction of the control vector). At decision step 836 a determination is made whether the control vector is within a step_size value of the minimum control vector value or if the control vector is greater than the step_size by the minimum value.

If the control vector is within a step_size value of the minimum control vector value, then the operation advances to step 840. At step 840, the digital controller unit decreases the control vector to the minimum value and the step_size value is reduced to its minimum also. Thereafter, the value adjustments end at step 858 and the loop reiterates by returning to step 804.

Alternatively, if at step 836 the control vector value is greater than the step_size value above the minimum value, then the operation advances to step 842. At step 842 the digital control unit decreases the control vector by the step_size value (codes). After step 842, the operation ends at step 858 and a new loop iteration occurs by returning to step 804.

Returning to step 832, if the up_dn value is a 1, meaning the output signal is greater than the target value, then the operation advances to decision step 846. At decision step 846, a determination is made regarding whether the control vector is less than the step_size below the maximum value, or if the control vector is within a step_size of the maximum value. If at decision step 846 the control vector is within a step_size of the maximum value, then the operation advances to step 850 and the digital control unit increases the control vector to the maximum value and also reduces the step_size value to the minimum value. Thereafter, the operation ends at step 858 and the loop reiterates by returning to step 804.

Alternatively, if the control vector is less than a step_size value below the maximum value, then the operation advances to step 854 and the digital control unit increases the control vector by a step_size size number of units, also referred to as values, increments or codes. The step size was calculated above at steps 812-828. Thereafter, the operation ends at step 858 and the loop repeats by returning to step 804.

Stated another way, in this example embodiment, the control vector is adjusted automatically based on the up_dn feedback signal from the analog portion of the loop. The digital control unit monitors the history of the up_dn signal over time to determine whether the control vector is significantly off target which in this embodiment is determined by the up_dn signal not changing over N consecutive loop iterations determined by N consecutive up_dn values in a shift register. The shift register stores the value of the up_dn signal each time the control loop is updated. During each iteration, the oldest stored value of the up_dn signal is discarded from the end of the stack while the newest value is inserted at the start. N may be any value, but high values cause the control value to change more slowly.

If the value of the up_dn signal is not the same N times in a row, the control loop has recently crossed its convergence point and the step size is reduced by half. This happens each time the control loop is updated until the step size becomes step_min (default 1). The time delay from the digital output back to the up_dn signal input is relatively small so eight loop iterations are enough to detect multiple crossings of the convergence point. In other embodiments a different number of iterations may be defined (used). At convergence, the step size should always be the minimum size although prior to that the control vector and even the gain may range above and below the target value as the desired gain level is found.

If the N most recent values of "up_dn" are the same, the step size is increased by one. The step size is doubled (or increased by some other increment or factor in other embodiments) when the control loop is updated until the maximum step size is reached or until the value of up_dn signal changes. In this embodiment, the step size equals $2^S$ where S is the step size register which is incremented or decremented. When S increases by one, the step size doubles. When S decreases by one, the step size is cut in half. In other embodiments, other mathematical algorithms may be implemented. If the control vector reaches the upper limit while up_dn is still logic level 1, the step size is immediately reduced to the minimum step size step_min value. If the control vector reaches the lower limit while "up_dn" is logic level 0, then the step size is reduced immediately to the step_min value. In one implementation, the dynamic step size may be selected by setting the step_mode register to "10" (default value).

The N loop iteration delay before increasing the step size gives valuable hysteresis so that instability is avoided. In the embodiment described herein, the step size remains small until 8 loop iterations have elapsed with the up_dn signal equal to 1. During this time, the control vector is being increased by small steps. Once the up_dn signal becomes logic level 0, the step size is immediately reduced, such as by half, of some other value. This asymmetrical behavior reduces the chance that the control vector will alternate by more than the minimum step size (default 1) at convergence. During simulation it was revealed that using dynamic step size mode as described in FIGS. 8A, 8B, only 35 loop iterations are required to re-acquire equilibrium in this example. This is a 96.5% improvement over using single-steps.

Figure 9:
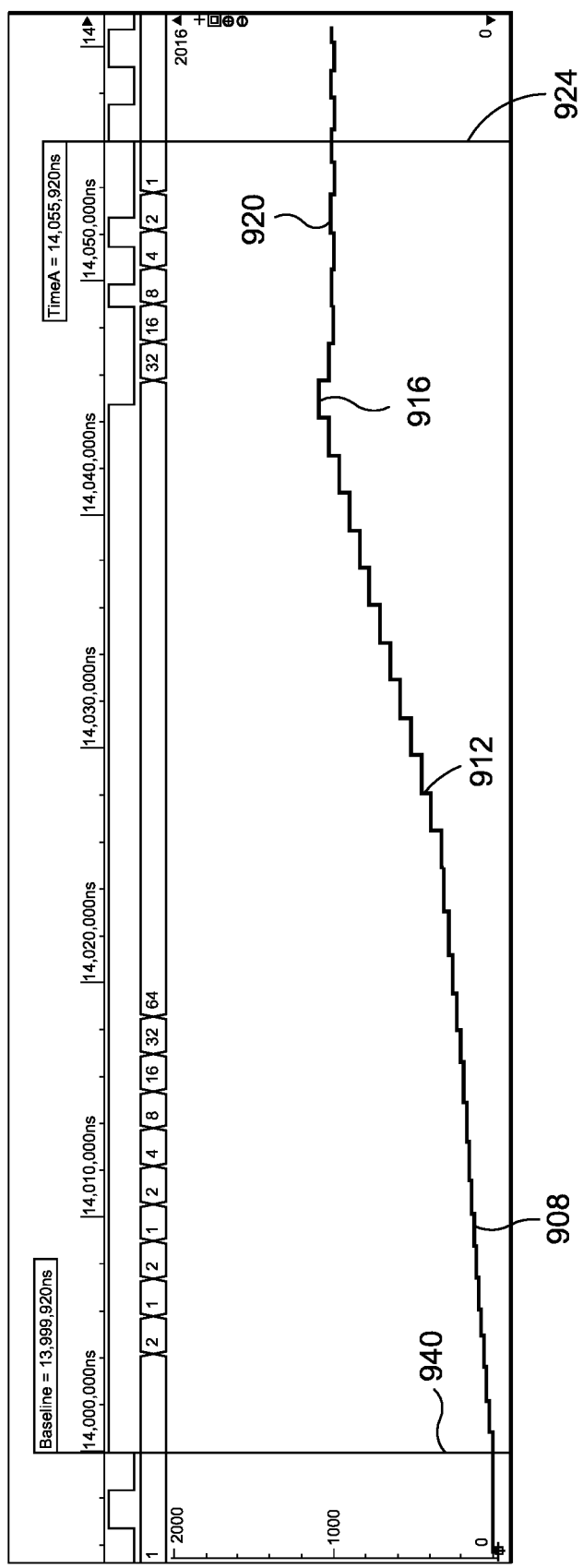
FIG. 9 illustrates an example plot of a control vector adjustment based on the method of FIG. 8A and FIG. 8B.

FIG. 9 illustrates an example plot of a control vector adjustment based on the method of FIGS. 8A and 8B. The vertical axis represents the control vector and the horizontal axis represents time. The control vector signal adjustment process starts at a time 904. During the initial phase, the signal is slowly increasing for the N number of iterations. At signal point 908, the N number of cycles has occurred and the step_size is doubled. In FIG. 9 the step size is shown above the plot and is shown with values, from left to right of 1, 2, 1, 2, 1, 2, 4, 8, 16, 32, 64, 32, 16, 8, 4, 2, 1. The numbers double from 1 to 2 to 4 to 8, etc., until the maximum step size of 64 steps is reached. This progression begins right about marker 908. Once the maximum step size is reached (marker 912), the control vector will be increased by this constant rate based on maximum step size until the convergence point is crossed. The portion of the plot 912 identifies the period when the step size is at its maximum (64). In other embodiments, other maximum steps sizes may be utilized.

Then, at signal point 916 the output signal magnitude has exceeded the target value thereby causing the control vector to begin to decrease. Then, during signal point 920, a state close to equilibrium has occurred and is reached at time 924.

While the dynamic step size described above works well, it can result in unwanted loop convergence behavior. For example, if a larger step size (e.g., 32×) is chosen it may cause the loop to stick in the larger step size mode, which will negatively impact the dither, and hence BER. This behavior constrains how fast the loop could operate. The rough equation for the worst-case convergence time with dynamic step size is shown below.

$$\text{Convergence time} = \text{clock period} \times \text{\# of digital loop states} \times \text{Averaging dynamic step size} \quad (2)$$

This equation is a 1st order approximation.

Dynamic Averaging

Another method to decrease the loop convergence time is to change the averaging applied to the UP/DN signal dynamically. The averaging used during operation is largely to avoid pattern dependency and to have good temperature cycling behavior. Based on lab measurements the loop averaging (counter value) can be set to 128 and still operate satisfactorily on startup when pattern dependency is less of an issue. This indicates that one can comfortably achieve an approximate increase in convergence speed of 32× (4096/128). The other upside is that not only can the system achieve a faster convergence time, but can also maintain good loop behavior. Please refer to FIG. 4 for a representative convergence behavior for a loop that makes use of "dynamic averaging". With dynamic averaging in place, the convergence time would roughly be:

$$\text{Convergence time} = \text{clock period} \times \text{\# of digital loop states} \times \text{Averaging/dynamic step size} \times \text{dynamic average speed up} \quad (3)$$

Figure 10:
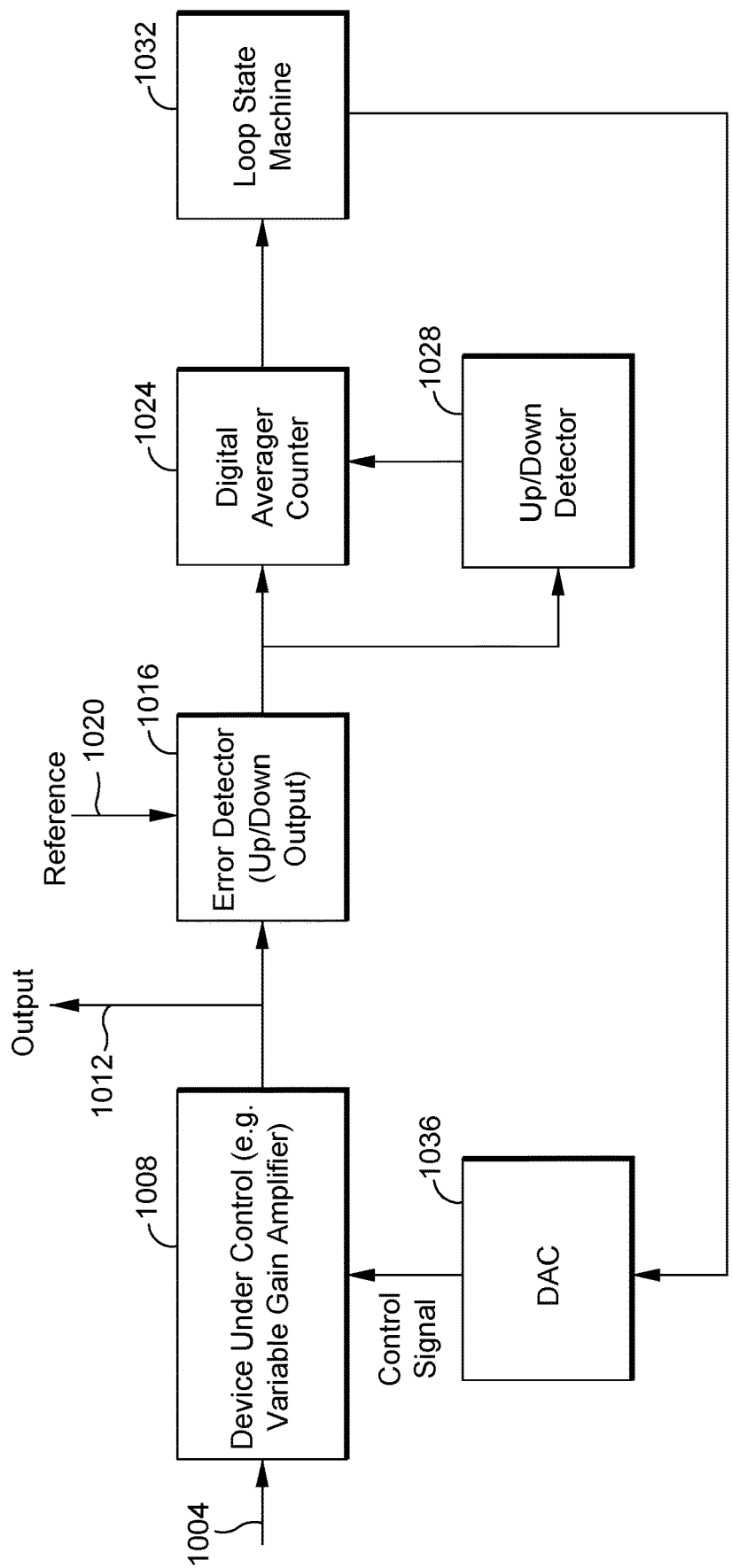
FIG. 10 illustrates a block diagram of an exemplary system with adjustable counter size.

FIG. 10 illustrates a block diagram of an exemplary system with adjustable counter size. This is but one possible embodiment and as such other configurations are possible that achieve a similar control function. In this embodiment, an input 1004 carries an input signal to a device under control, such as an amplifier 1008. Although shown and described as an amplifier for this discussion and to aid in understanding, it is disclosed that any device or element under control of a feedback loop could be used and would benefit from the loop control system and method as described herein.

In this embodiment, the amplifier 1008 is configured to maintain its output signal magnitude at a reference value, such that loop feedback provides a control signal to cause the amplifier to increase or decrease gain. As discussed herein, at start up, or upon reset, the output value of the amplifier may be far from the reference value at which the amplified signal should be. It is desired to converge the amplified signal to the reference value quickly as is discussed below.

The output of the amplifier, which is the amplified signal, is provided as an output on output path 1012 and to an error detector 1016. The error detector 1016 also receives the reference signal from input 1020. The error detector 1016 compares the amplified signal to the reference value. Based on the comparison, the error detector 1016 outputs an up signal or a down signal to a digital average counter 1024 and to an up/down detector (tracker). The error detector may comprise a comparator or any other device capable of comparing a signal to a reference value. The reference value may be provided to the error detector 1016 at manufacturing, at start up, or may be adjusted dynamically during operation or based on input via a user interface (not shown). A memory or register may store the reference value.

The digital average 1024 may be configured as a counter that has a counter size that can be adjusted during operation. The counter size ranges from zero to max counter size. The counter size is a value that the counter must reach before it generates an output, typically a logic 1 value or logic 0 value, and then resets. In one embodiment, upon reset, the counter is reset to a midpoint value between zero and max counter size. Based on control input from the up/down detector (tracker) 1028, the counter size can be adjusted. For example, the counter size may range from zero to 4096, or from zero to 265, or any range. For large counter sizes, more inputs are required to advance the counter value to the max counter value or decrease the counter value to zero counter value. For smaller counter sizes, fewer inputs are required to advance the counter value to the max counter value or decrease the counter value to zero. The digital averager counter 1024 is incremented upward with every up signal output from the error detector 1016 and decremented downward with every down signal output from the error detector 1016. Upon reaching max counter value, the digital averager counter 1024 outputs a logic 1 value and upon reaching zero counter value, the digital averager counter outputs a logic zero value. After reaching max counter value or zero, the counter value is reset to a midpoint value between zero and max counter value and the processes repeats.

The up/down detector 1028 monitors and tracks the up/down output from the error detector 1020. The up/down detector 1028 may comprise memory, registers, control logic, software, or any other elements or combination thereof configured to perform as described herein. Upon receiving a pre-determined pattern of up/down signals, the up/down detector adjusts the counter size of the digital averager counter 1024. In a different embodiment, the pre-determined pattern may be a consecutive number of either up signals or a consecutive number of down signals, such as but not limited to eight consecutive identical signals. In one embodiment, the pre-determined pattern may be a certain number of either up signals or down signals out of a larger group of signals, such as but not limited to six up signals out of the last eight signals from the error detector.

When this pre-determined pattern is met, it is an indication that the amplified signal is far from the reference value. The amplified signal may be much greater than the reference value or far below the reference value. As such, reducing the time for the amplified signal value to be at or near the reference value, can be achieved by reducing the counter size. Reducing the counter size reduces the number of up outputs, from the error detector 1020, required for the digital averager counter 1024 to reach maximum count value which is, as discussed below, required to increase the gain of the amplifier 1008. Similarly, reducing the counter size reduces the number of down outputs, from the error detector 1020, required for the digital averager counter 1024 to reach zero count value, which is required to reduce the gain of the amplifier 1008, also discussed below. In one embodiment, the counter size starts at 4096 and over time, in response to the error detector outputting the predetermined patterns of values (signal), and is reduced in size to 2048, to 1024, to 512, to 256. At any time if the error detector output does not match the predetermined pattern, then the counter may be reset to its max size, such as 4096.

A control signal from the up/down detector 1028 to the digital averager counter 1024 controls the counter value for the digital averager counter. If the pre-determined pattern occurs several times in a row, the counter size may be reduced several times in a row, such as from 4096, to 2048, to 1024, and so on all the way down to 256. These numbers are provided for purposes of understanding only and as such, other embodiments may have different counter size values. However, in one embodiment, if the up/down detector 1028 receives a pattern of inputs that do not meet the predetermined criteria, then this is an indication that the amplified signal is at or near the reference value, and a such the up/down detector resets the counter size of the digital averager counter 1024 to it's largest value, such as 4096 in this example embodiment.

The output of the digital averager counter 1024 is provided to a loop state machine which increase or decreases a digital control value that represents the current gain state. The loop state machine may comprise one or more of memory, control logic, software, processors, comparators, registers, or any combination of these elements configured to monitor and track a series of up/down signals from the error detector 1016 and compare the series of up/down signal to a predetermined pattern. After increasing or decreasing the digital control value that represents the current gain state, the digital value is provided to a digital to analog converter 1036, which converts the digital control value to an analog signal, which is then provided to the amplifier as a gain control signal to adjust the gain. The gain may be adjusted upward or downward.

Figure 11:
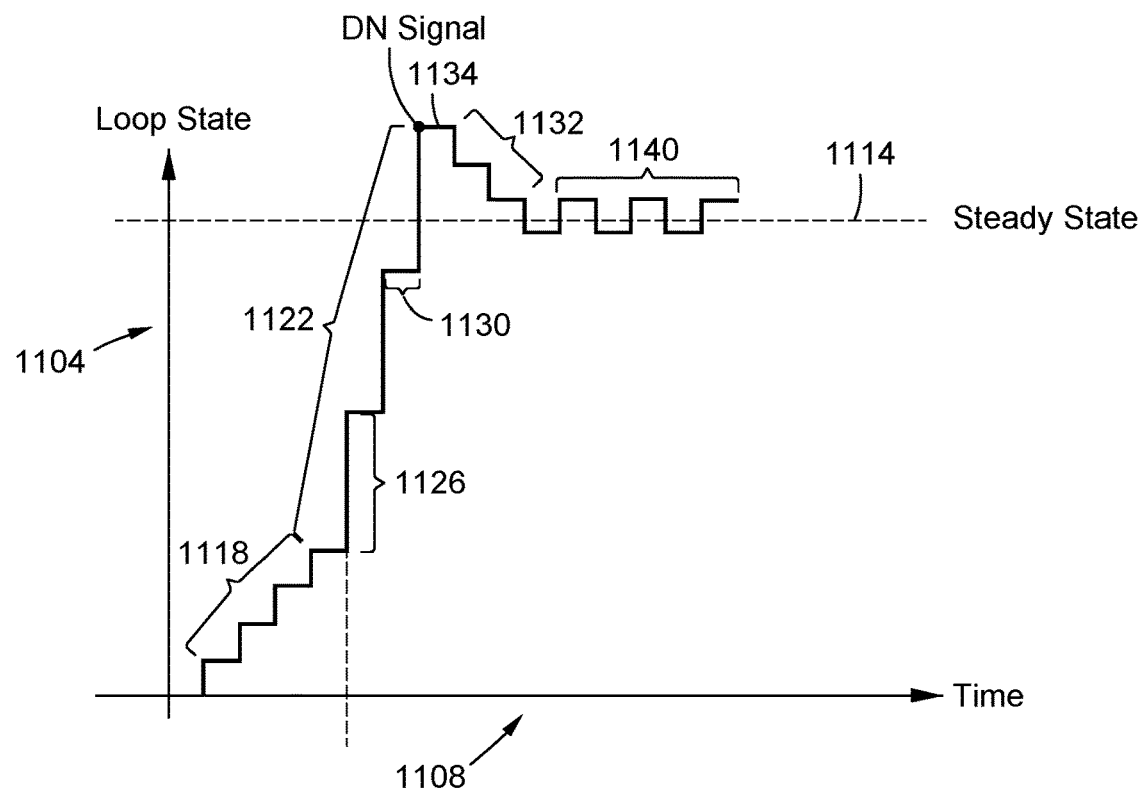
FIG. 11 illustrates a plot of the dynamic step size described in the parent application.

FIG. 11 illustrates a plot of the dynamic step size described in the parent application. The horizontal axis 1108 represents time while the vertical axis 1108 represents loop state. The loop state is the representative of the gain control signal. During the first signal portion 1118, the step sizes are fixed a normal step size. After this small step size occurs for a period, the step size is changed to a large step size 1126 for a second signal portion 1122. Note that for both the first signal portion 1118 and the second signal portion 1122, the time it takes to adjust the gain, denoted by time period 1130 is the same. Thus, even though the step sizes increase, the time between step size change is fixed.

This process repeats until point 1134. However, at point 1134 the gain value has overshot the desired steady state level 1114. Then, it takes signal portion 1138, and the extra time associated therewith, to approach steady state. Thereafter, the loop control maintains the gain value at steady state in signal portion 1140. The constant time between step size changes and the overshoot is overcome with the system shown in FIG. 10 and the resulting method of operation.

Figure 12:
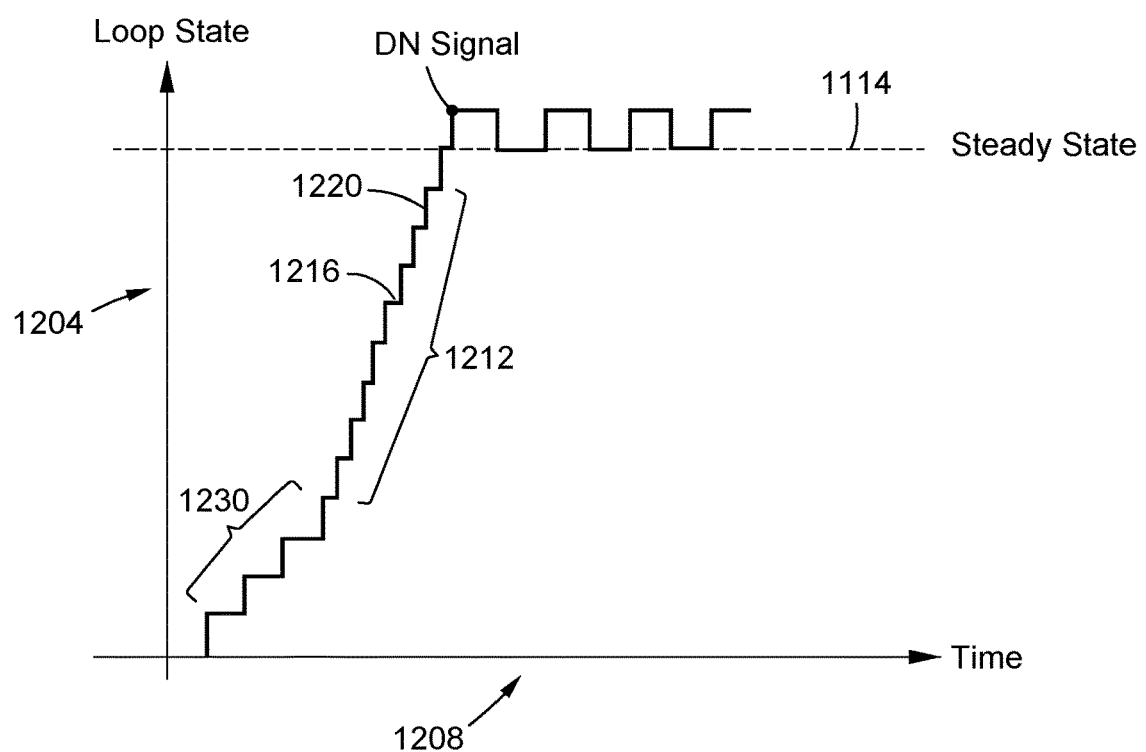
FIG. 12 illustrates a signal plot based on the system shown in FIG. 10.

FIG. 12 illustrates a signal plot based on the system shown in FIG. 10. This plot is exemplary only and provided for purposes of discussion and to aid understanding. The horizontal axis 1208 represents time while the vertical axis 1204 represents loop state. As can be seen in comparison to FIG. 11, during a signal plot portion 1212 the time 1216 between changes in gain values (step) is smaller than the time between step changes in signal plot portion 1230. This reduces the time it takes for the actual gain level to reach the ideal gain level, which is at or near steady state value 1114, and reduces or eliminates the overshoot associated with prior art methods and the dynamic step size of the parent application.

Figure 13:
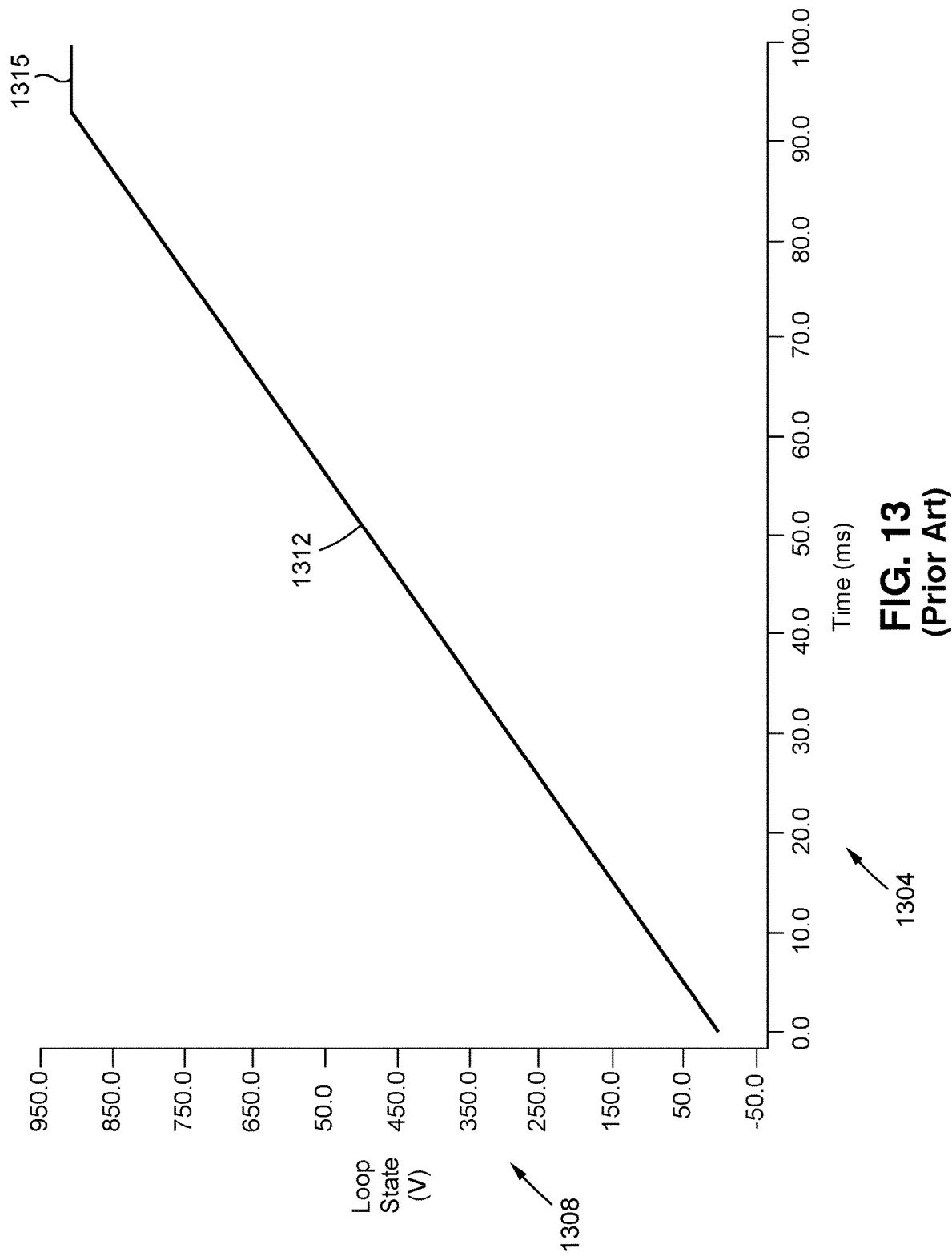
FIG. 13 illustrates a signal plot of a prior art loop control.
Figure 14:
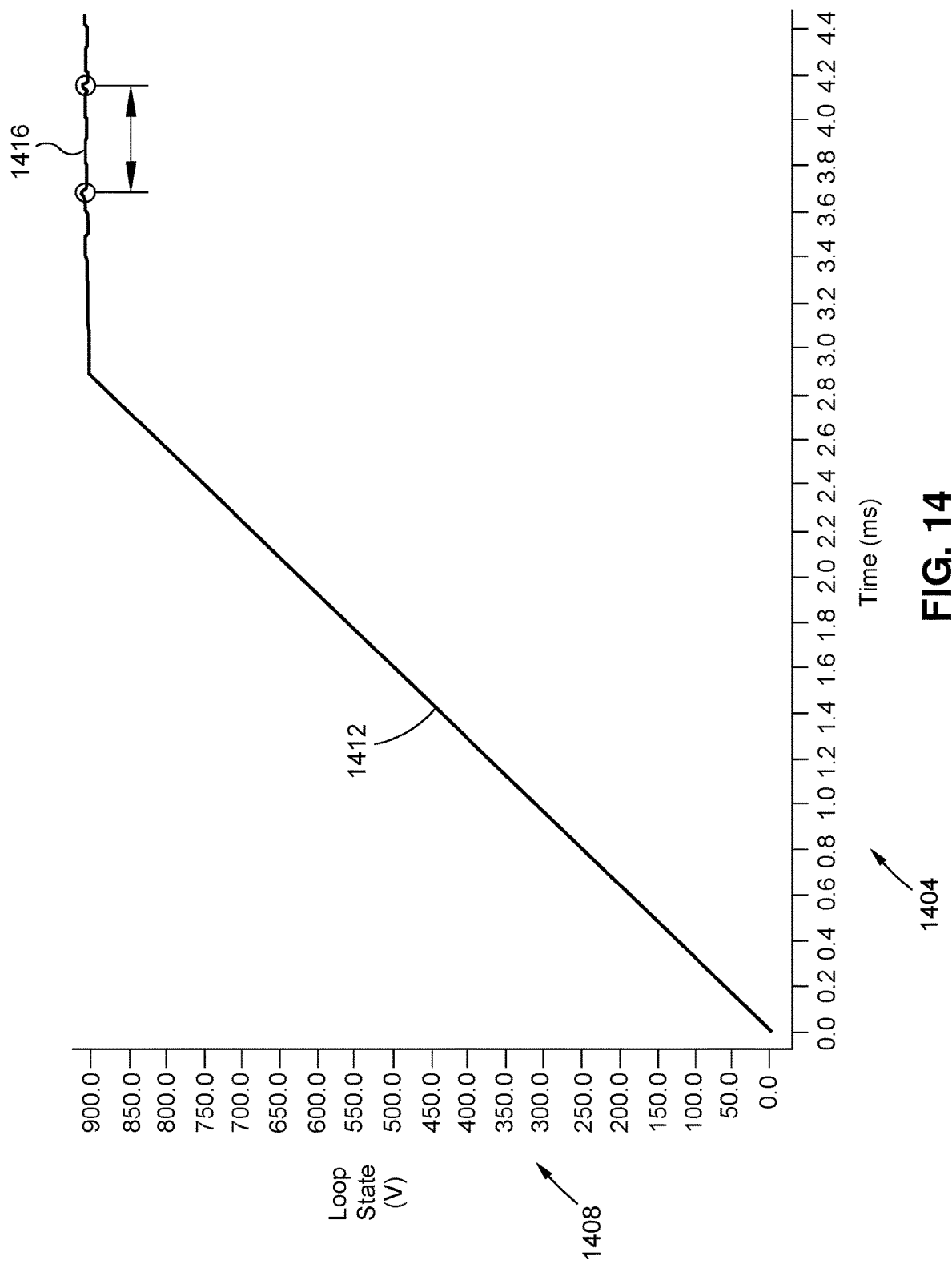
FIG. 14 illustrates a signal plot of a loop control based on the innovation disclosed herein.
Figure 15:
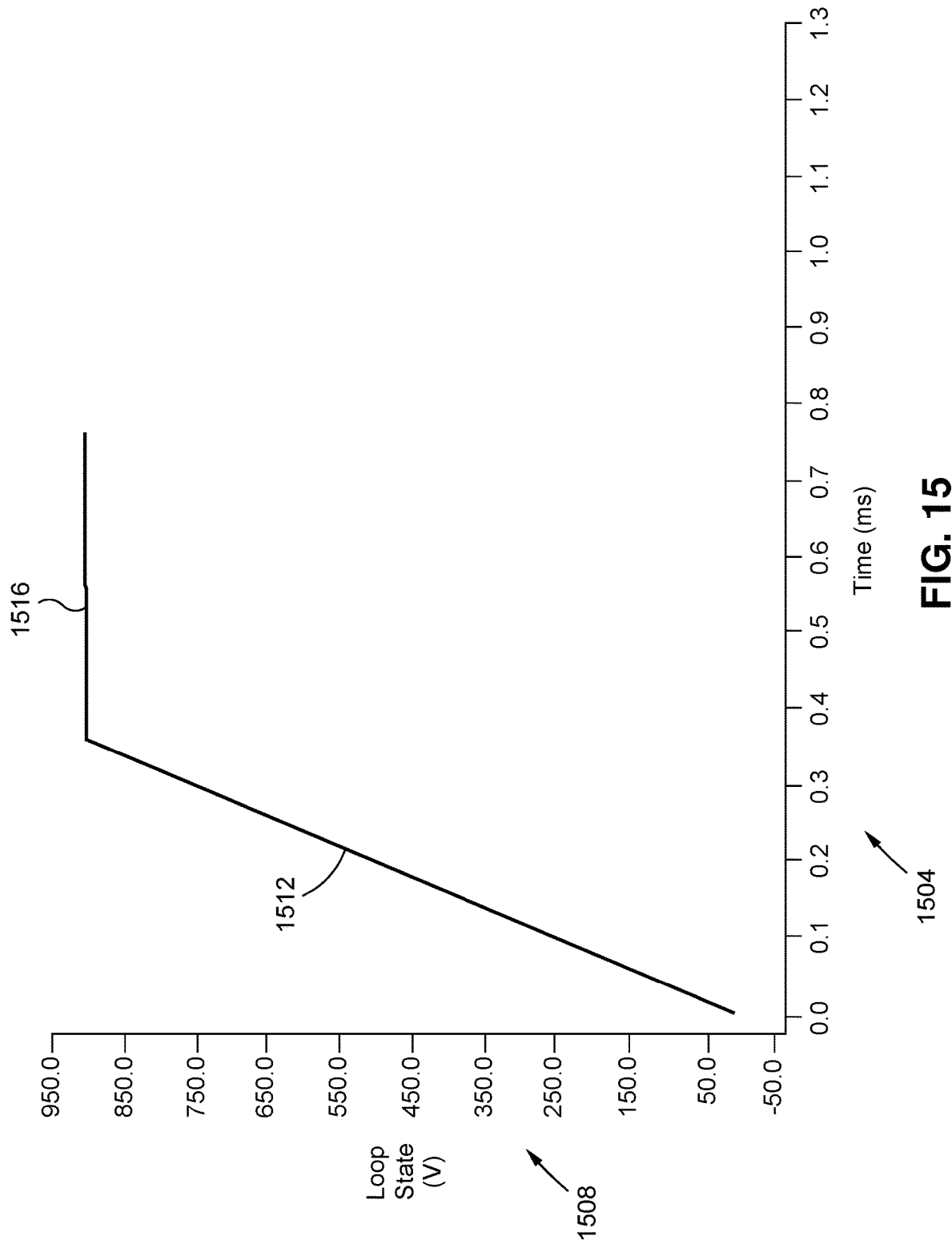
FIG. 15 illustrates an exemplary signal plot for a loop control system combining dynamic step size and variable counter size.

The system shown in FIG. 10 have been implemented and tested. The following FIGS. 13, 14, and 15 show the improvements as proven by actual signal plots. FIG. 13 illustrates a signal plot of a prior art loop control. The horizontal axis 1304 represents time while the vertical axis 1308 represents loop state in volts. As shown, the signal plot 1312 slowly ramps up to the steady state level 1316. In this prior art system, it takes approximately 90 microseconds. During this time, the gain level of the amplifier, or any other device under control, is not at the proper level thereby inhibiting desired system operation and possibly preventing subsequent systems from beginning operations, such as training procedures.

FIG. 14 illustrates a signal plot of a loop control based on the innovation disclosed herein. The horizontal axis 1404 represents time while the vertical axis 1408 represents loop state in volts. As shown, the signal plot 1412 quickly ramps up to the steady state level 1416. In this system, convergence occurs approximately 33 times faster than in the prior art plot of FIG. 13. This speeds system operation and allows subsequent systems to begin operations, such as training procedures.

It is also contemplated that the method and apparatus of the parent application and the variable counter size method disclosed herein may be combined to allow for greater improvements. The loops may operate separately or be configured into a single loop to allow for dynamic steps sizes as well as having variable counter sizes. Thus, the counter step size can be reduced to speed convergence to steady state, but the step size (step size increasing or decreasing in gain), can be increased which also speeds convergence to steady state.

FIG. 15 illustrates an exemplary signal plot for a loop control system combining dynamic step size and variable counter size. The horizontal axis 1504 represents time while the vertical axis 1508 represents loop state in volts. As shown, the signal plot 1512 quickly ramps up to the steady state level 1516. In this system, convergence occurs approximately 100 times faster than in the prior art plot of FIG. 13. This speeds system operation and allows subsequent systems to begin operations, such as training procedures.

Figure 16A:
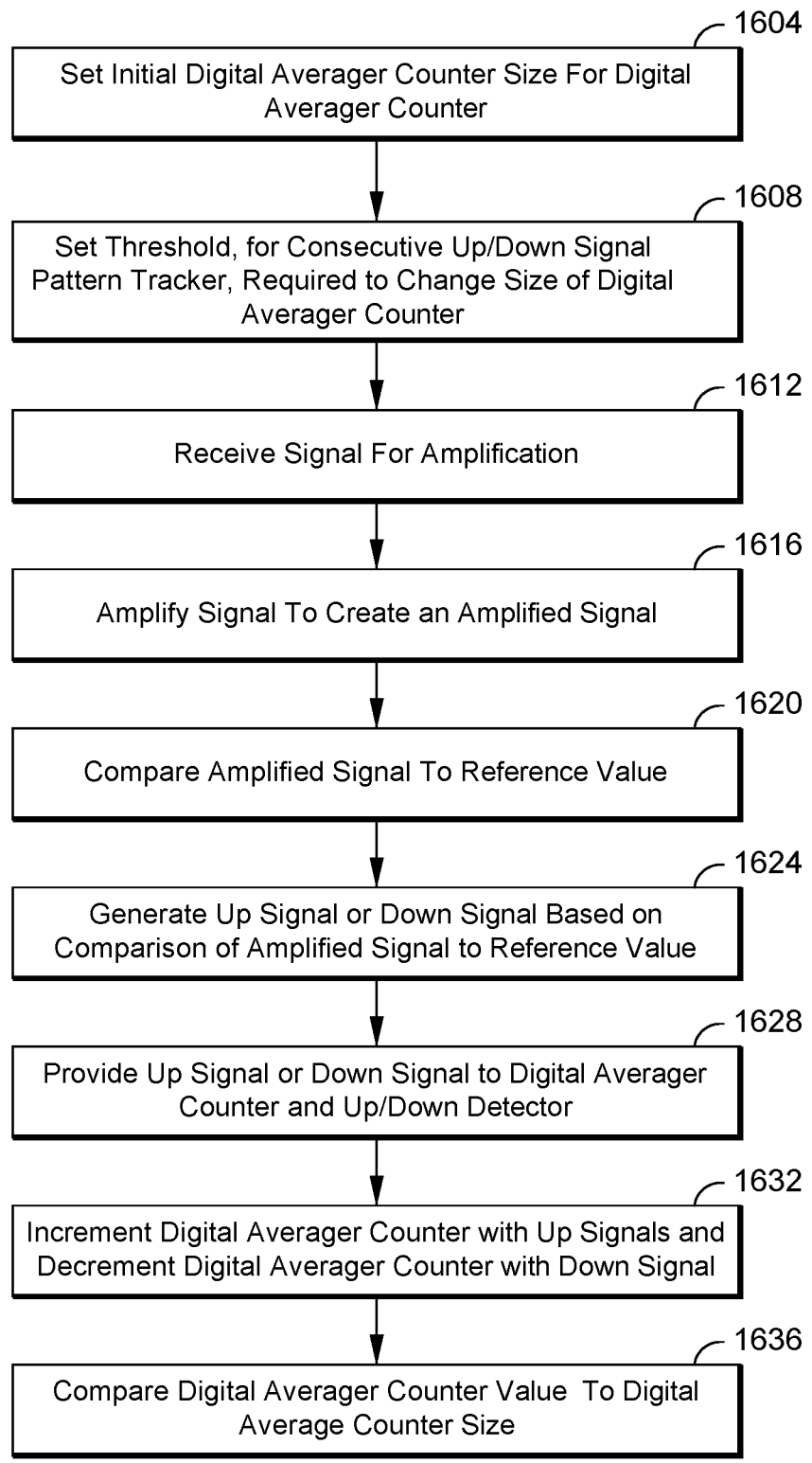
FIGS. 16A and 16B illustrate an exemplary method of operation of one example embodiment of a loop control system with variable counter size.
Figure 16B:
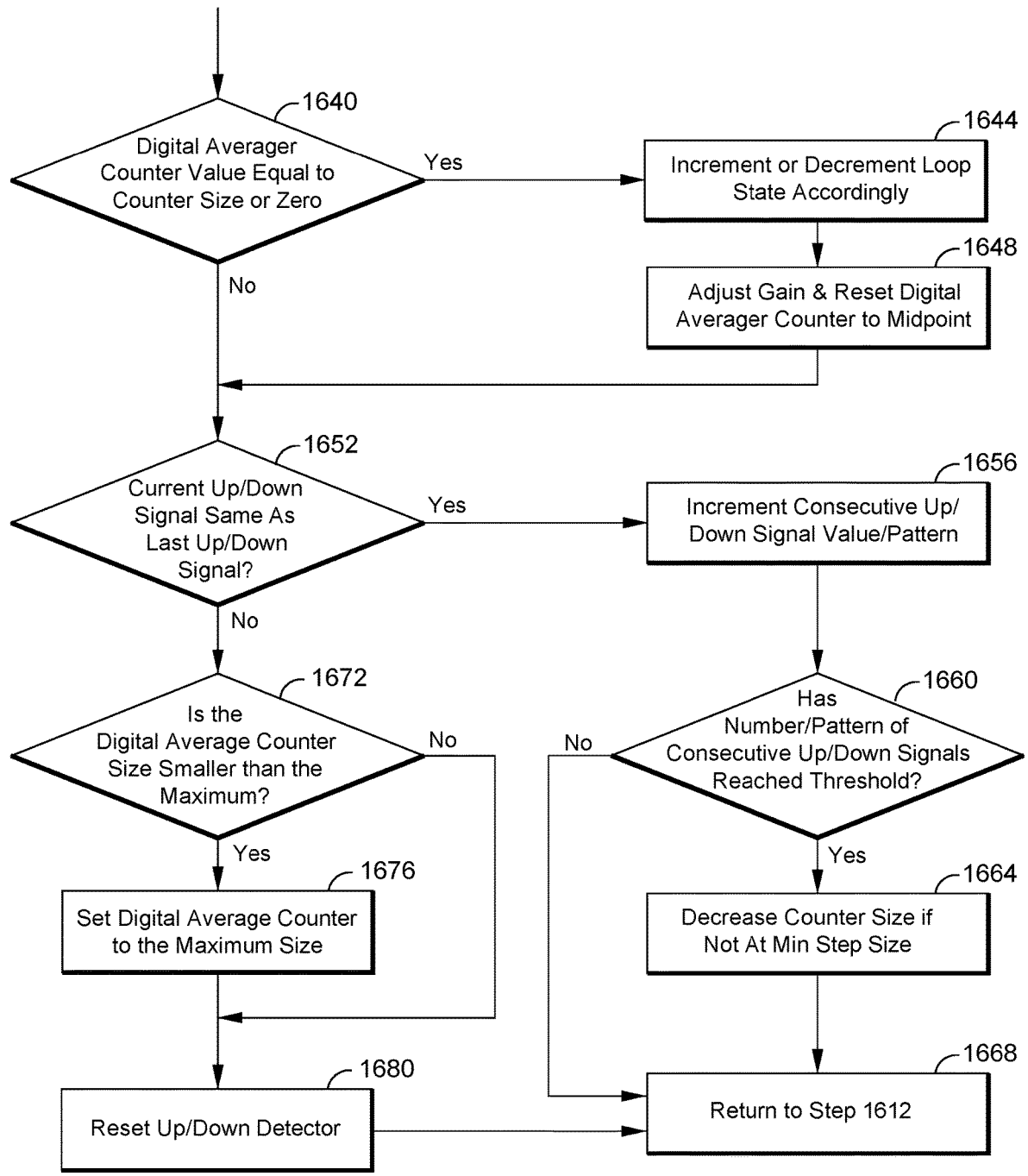

FIGS. 16A and 16B illustrate an exemplary method of operation of one example embodiment of a loop control system with variable counter size. This is but one possible method of operation and as such, other methods of implementing a variable counter size are contemplated and possible. At a step 1604, this method of operation sets the initial digital averager counter size for the digital averager counter. The digital averager counter size is the size of the counter or other element that determines how many up inputs or down inputs, beyond the number of opposing up or down inputs, which must be received before the digital averager counter will output a one or zero output. For example, the counter size may be 4096 and if the starting value for the counter is the midpoint of 2048, then 2048 up signals would be required, beyond the amount of any down signals received, to output a logic one output from the digital averager counter. Similarly, the counter size is 2048 and the starting value for the counter is the midpoint of 1024, then 1024 down signals would be required, beyond the amount of any up signals received, to output a logic zero output from the digital averager counter. As discussed below, during operation the counter size may be changed to adjust the rate at which the device under control converges to its desired level or value.

At a step 1608 the threshold is set, for the consecutive up/down signal pattern tracker, that is required to change the size of the digital averager counter. For example, the up/down signal pattern may be set to various patterns of up/down signals. And upon receiving the defined patterns of up/down signals, the counter size can be changed.

At a step 1612 the amplifier (device under control) receives an incoming signal that is to be amplified to, at, or near the reference value. Although discussed in relation to an amplification level, the device under control could be any device being control by a loop, which would benefit from improved loop convergence time. At a step 1616, the amplifier amplifies the received signal to create an amplified signal. Then, at a step 1620 the amplified signal is compared to the reference value with an error detector or any type of comparator. The reference value is the value which the received signal should be after amplification. The reference value may be stored in a memory or registers and it may be set at the time of manufacture, by a user at a later time, or adjusted dynamically during operation. A user interface, not shown, may provide means to set or change the reference value.

At a step 1624, based on the comparison at step 1620, the error detector generates and outputs an up signal or a down signal. An up signal indicates that the amplified signal is less than the reference value and a down signal indicates that the amplified signal is greater than the reference value. The up signal or down signal output from the error detector is provided to the digital averager counter at a step 1628. At a step 1632, upon receipt of the up signal, the digital averager counter increments its count while receipt of a down signal causes the digital averager counter to decrement its count by one. Then, at a step 1636, a comparison occurs between the current count of the digital averager counter value to the digital averager counter size.

Turn to FIG. 16B, at decision step if the digital averager counter value is equal to the counter size or to zero, then the operation advances to a step 1644. At a step 1644, because the counter has reached its maximum or minimum size, it will generate an output, which results in an output that increments or decrements the loop state. The loop state may be a digital value which represents the gain value for the amplifier. A logic one output from the counter results in the loop state being incremented while a logic zero value from the counter results in the loop state being decremented. Incrementing the loop state increases the gain of the amplifier while decrementing the loop state results in a reduction of the amplifier gain. In other embodiment, other notations may be established.

From step 1644, the operation advances to step 1648 and the gain is adjusted based on the change in loop state. In reference to FIG. 10, the gain is adjusted due to the loop state being provided, as a digital value, to the DAC, which then provides an analog control signal to the amplifier. At step 1648, the digital averager counter is re-set to its mid-point, which, in this embodiment, is between zero and the max counter size. This step may alternatively occur later in this method of operation. After step 1648, the operation advances to decision step 1652.

Alternative, if at decision step 1640 determines that the digital averager counter size is not equal to the counter max or min value, then the operation advances to a decision step 1652. At decision step 1652 a determination is made whether the current up/down signal from the error counter is the same as the last up/down signal. In this embodiment, the pattern is a certain number of consecutive up signals or down signals. In other embodiment, the pattern of prior up/down signals that must be met may be other than consecutive, such as a certain number of up/down signal in a group of most recent received signals. If the pattern of the up/down detector has not been met, then operation advances to step 1672. At step 1672, a determination occurs whether the current digital average counter size is smaller than the maximum counter size. If so, then then the operation advances to step 1676 and the system sets the digital average counter size to the maximum size. Thereafter, the operation advances to step 1680 and the up/down detector is reset due to the most recent up/down signal not being the same as the last up/down signal. After step 1680, the operation advances to step 1668 and operation returns to step 1612. If at step 1672 the digital average counter size is not smaller than the maximum, then the operation advances to step 1680. At step 1680 the up/down detector is reset and thereafter the operation advances to step 1668.

Alternatively, if at step 1652 the current up/down signal is the same as the prior up/down signal, then the operation advances to step 1656 and the pattern within the up/down detector is updated to reflect another up signal or down signal that was identical to the prior signal from the error detector. Then at decision step 1660, a determination is made whether the number (or pattern) of consecutive up signals or consecutive down signals meet the threshold value (or pattern). For example, the threshold may be eight consecutive up signals or eight consecutive down signals. In other embodiments, the predetermined number or pattern may change.

If at step 1660 the consecutive number of up signals or consecutive down signals does not meet the threshold value, then the operation advances to step 1668, the system operation returns to step 1612. Alternatively, if at step 1660 the consecutive number of up signals or consecutive down signals meets the threshold value, then operation advances to step 1664 and the system decreases the digital averager counter size if the counter is a not already at its minimum value. In this method of operation, the counter size may be decreased by half, or some other multiple or amount. In one embodiment, the counter size starts at 4096, but over time, will decrease in set wise fashion to 256. After step 1668, the operation returns to step 1668, and then to step 1612.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A system for controlling gain of a variable amplifier comprising:
   an error detector configured to compare an amplifier output to a reference value and responsive thereto output an error signal;
   a counter, having a counter size, configured to maintain a counter value reflecting the error detector output over time and responsive to the counter value reaching the counter size, outputting a gain control signal; and
   an error detector signal monitor configured to track the error detector signal over time, and responsive to the error detector signal meeting a predetermined pattern, providing a counter size control signal to the counter to reduce the counter size which reduces a time required for the amplifier output to reach the reference value.

2. The system of claim 1 wherein the reference value comprises an ideal amplifier output magnitude.

3. The system of claim 1 further comprising a loop state machine and a digital to analog converter such that the loop state machine is configured to convert the gain control signal to a digital gain control value, which is provided to the digital to analog converter, which converts the digital gain control value to an analog gain control signal that is provided to the variable amplifier.

4. The system of claim 1 wherein the error detector signal monitors, responsive to the error detector signal not meeting the predetermined pattern, configured to increase the counter size.

5. The system of claim 4 wherein increasing the counter size comprises resetting the counter size to a maximum counter size.

6. A method for controlling gain of a variable gain amplifier comprising:
comparing a variable gain amplifier output signal to a reference value to determine if the variable gain amplifier output signal is greater than or less than the reference value;
responsive to the variable gain amplifier output signal being greater than the reference value, generating an up signal;
responsive to the variable gain amplifier output signal being less than the reference value, generating a down signal;
updating a counter responsive to an up signal and responsive to a down signal;
tracking a number of up signals and down signals in relation to a predetermined pattern;
responsive to the counter reaching a maximum counter value or a minimum counter value, outputting a counter output signal to adjust the gain of the variable gain amplifier;
responsive to the number of up signals and down signals in relation to the predetermined pattern meeting the predetermined pattern, changing the size of the counter.

7. The method of claim 6 wherein the reference value comprises an ideal amplifier output magnitude.

8. The method of claim 6 wherein updating a counter responsive to an up signal and a down signal comprises incrementing a counter value in response to an up signal and decrementing the counter value in response to a down signal.

9. The method of claim 6 wherein tracking comprises monitoring a series of prior signals from the error detector and comparing the series of prior signals to the predetermined pattern such that if the series of prior signals from the error detector matches the predetermined pattern, then reducing the counter size.

10. The method of claim 6 wherein the counter size is the maximum counter value that must be reached before the counter outputs a counter output.

11. The method of claim 6 wherein the pattern is a predetermined consecutive number of up signals or a predetermined consecutive number of down signals.

12. The method of claim 6 wherein the pattern is a predetermined number of up signals or a predetermined consecutive number of down signals in relation to a predetermined number of up signals and down signals.

13. The method of claim 6 further comprising, responsive to the counter value reaching the counter size value or predetermined counter minimum value, resetting the counter to a counter midpoint value.

14. A system to control convergence of a control loop to a reference value comprising:
a device, under control of the control loop, configured to generate an output signal;
a comparator configured to:
compare the output signal to a reference value;
responsive to the output signal being less than the reference value, output an up signal; and
responsive to the output signal being greater than the reference value, outputting a down signal;
a counter having a counter size that defines a counter maximum value and a counter minimum value, the counter configured to maintain a counter value which is incremented in response to an up signal and decremented in response to a down signal, such that the counter outputs a gain control value;
a up/down signal tracker configured to:
track a pattern of up signals and down signals and compare the pattern to one or more predetermined patterns;
responsive to the up signals and down signals matching one of the one or more predetermined patterns, changing the counter size.

15. The system of claim 14 wherein the up/down signal tracker comprises memory and one or more comparators.

16. The system of claim 14 wherein changing the counter size comprises sending a control signal to the counter to reduce the size of the counter.

17. The system of claim 14 wherein the device under control of the control loop is a variable gain amplifier.

18. The system of claim 14 wherein comprising a loop state machine configured to, responsive to the gain control value from the counter, increase or decrease a digital gain control value.

19. The system of claim 14 further comprising, responsive to the up signals and down signals not matching one of the one or more predetermined patterns, increasing the counter size.

20. The system of claim 14 further comprising a system for performing dynamic step size adjustment.

* * * * *